(12) United States Patent
Hayashi

(10) Patent No.: US 10,476,493 B2
(45) Date of Patent: Nov. 12, 2019

(54) BUFFER CIRCUIT, SEMICONDUCTOR INTEGRATED CIRCUIT DEVICE, OSCILLATOR, ELECTRONIC APPARATUS, AND BASE STATION

(71) Applicant: SEIKO EPSON CORPORATION, Tokyo (JP)

(72) Inventor: Kenji Hayashi, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 117 days.

(21) Appl. No.: 15/332,778

(22) Filed: Oct. 24, 2016

(65) Prior Publication Data

US 2017/0126221 A1 May 4, 2017

(30) Foreign Application Priority Data

Oct. 30, 2015 (JP) ................... 2015-214461

(51) Int. Cl.
| | |
|---|---|
| *H03K 17/06* | (2006.01) |
| *H01L 29/78* | (2006.01) |
| *H01L 23/528* | (2006.01) |
| *H01L 29/423* | (2006.01) |
| *H03B 5/02* | (2006.01) |
| *H03B 5/36* | (2006.01) |
| *H03K 19/007* | (2006.01) |

(Continued)

(52) U.S. Cl.
CPC ............ *H03K 17/063* (2013.01); *H01L 23/34* (2013.01); *H01L 23/5283* (2013.01); *H01L 29/4238* (2013.01); *H01L 29/7803* (2013.01); *H01L 29/7813* (2013.01); *H03B 5/02* (2013.01); *H03B 5/364* (2013.01); *H03K 19/0075* (2013.01); *H01L 23/528* (2013.01); *H01L 27/0207* (2013.01); *H01L 27/088* (2013.01); *H01L 27/092* (2013.01); *H03B 2200/0034* (2013.01)

(58) Field of Classification Search
CPC .. H03B 5/364; H03B 5/06; H03B 2200/0012; H03B 5/36; H03B 2200/0062; H03B 2200/0088; H03B 2200/009; H03B 5/04; H03B 5/1212; H03B 5/1228; H03B 5/1243; H03B 5/368; H03B 2200/0034; H01L 23/34; H01L 23/528; H01L 27/0207; H01L 27/088; H01L 29/0364; H01L 29/4238; H01L 23/5283
USPC ............... 331/158, 116 FE, 117 FE; 327/112
See application file for complete search history.

(56) References Cited

U.S. PATENT DOCUMENTS 7,579,917 B2 * 8/2009 Sakai .................. H03K 5/06
331/158
8,901,661 B2 * 12/2014 Mauder ............... H01L 29/0615
257/368

(Continued)

FOREIGN PATENT DOCUMENTS

| JP | 2003-338710 A | 11/2003 |
|---|---|---|
| JP | 2007-259052 A | 10/2007 |
| JP | 2012-257183 A | 12/2012 |

*Primary Examiner* — Arnold M Kinkead
(74) *Attorney, Agent, or Firm* — Oliff PLC

(57) ABSTRACT

A buffer circuit includes a first MOSFET including a first source electrode, a first gate electrode, and a first drain electrode, and a second MOSFET, which includes a second source electrode, a second gate electrode, and a second drain electrode, and is same in polarity as the first MOSFET, and the first gate electrode and the second gate electrode are electrically connected to each other.

20 Claims, 10 Drawing Sheets

(51) Int. Cl.
*H01L 23/34* (2006.01)
*H01L 27/02* (2006.01)
*H01L 27/088* (2006.01)
*H01L 27/092* (2006.01)

(56) References Cited

U.S. PATENT DOCUMENTS

| | | | |
|---|---|---|---|
| 2002/0070760 A1* | 6/2002 | Nakayama | H01L 27/0921 326/121 |
| 2003/0098749 A1 | 5/2003 | Terasawa et al. | |
| 2007/0236302 A1 | 10/2007 | Sakai et al. | |
| 2012/0313718 A1 | 12/2012 | Nakamura et al. | |

* cited by examiner

BUFFER CIRCUIT, SEMICONDUCTOR INTEGRATED CIRCUIT DEVICE, OSCILLATOR, ELECTRONIC APPARATUS, AND BASE STATION

CROSS-REFERENCE TO RELATED APPLICATIONS

This application claims priority to Japanese Patent Application No. 2015-214461, filed Oct. 30, 2015, the entirety of which is hereby incorporated by reference.

BACKGROUND

1. Technical Field

The present invention relates to a buffer circuit, a semiconductor integrated circuit device, an oscillator, an electronic apparatus, and a base station.

2. Related Art

There has been known an oscillation circuit provided with a constant voltage generation circuit, an oscillation output generation circuit, an output circuit having a plurality of MOSFET circuits supplied with a constant voltage generated by the constant voltage generation circuit as a power supply voltage arranged in parallel to each other so that the respective output points of the MOSFET circuits are connected to each other, and a drive circuit for driving the MOSFET circuits, which have been selected from the plurality of MOSFET circuits in accordance with a selection input, in accordance with an oscillation output, and capable of changing the drive capability by setting the outputs of the MOSFET circuits, which have not been selected in accordance with the selection input, to a high impedance (see, e.g., JP-A-2012-257183).

In the oscillation circuit described in JP-A-2012-257183 described above, when changing the drive capability, since the number of the MOSFET circuits through which a current flows is changed, the width of a current path also changes. Here, an electromigration (EM) resistance is proportional to the width of the current path. Therefore, in the case in which the width of the current path decreases due to the change, there has been a problem that the electromigration resistance also decreases.

SUMMARY

An advantage of some aspects of the invention is to provide a buffer circuit, a semiconductor integrated circuit device, an oscillator, an electronic apparatus, and a base station in which the width of the current path does not largely change even if the drive capability is changed.

The invention can be implemented as the following aspects or application examples.

APPLICATION EXAMPLE 1

A buffer circuit according to this application example of the invention includes a first MOSFET including a first source electrode, a first gate electrode, and a first drain electrode, a second MOSFET including a second source electrode, a second gate electrode, and a second drain electrode, and a third MOSFET including a third source electrode, a third gate electrode, and the first drain electrode, the first MOSFET and the second MOSFET are the same in polarity as each other, and the first gate electrode and the second gate electrode are electrically connected to each other.

According to the buffer circuit related to this application example, even if the selection of the plurality of MOSFETs is changed, it is hard for the total width of the interconnections of the current paths to significantly change. In other words, according to the buffer circuit related to the present application example, even if the drive capability is changed, it is hard for the width of the current path to decrease, and thus, the electromigration resistance can be maintained in good condition. Thus, it is possible for the buffer circuit according to the present application example to operate with high reliability even if the drive capability is changed.

APPLICATION EXAMPLE 2

The buffer circuit according to the application example described above may further include a fourth MOSFET including a fourth source electrode, a fourth gate electrode, and the second drain electrode, and the third MOSFET and the fourth MOSFET may be the same in polarity as each other.

According to the buffer circuit related to this application example, even if the drive capability is changed, it is hard for the width of the current path to decrease, and thus, the electromigration resistance can be maintained in good condition. Thus, it is possible for the buffer circuit according to the present application example to operate with high reliability even if the drive capability is changed. Further, by sharing the first drain electrode by the first MOSFET and the third MOSFET, and sharing the second drain electrode by the second MOSFET and the fourth MOSFET, the layout area of the buffer circuit can further be reduced.

APPLICATION EXAMPLE 3

The buffer circuit according to the application example described above may further include a first switch connected to the third gate electrode.

According to the buffer circuit related to this application example, it is possible to easily change the drive capability.

APPLICATION EXAMPLE 4

A buffer circuit according to this application example of the invention includes a first MOSFET including a first source electrode, a first gate electrode, and a first drain electrode, a second MOSFET including a second source electrode, a second gate electrode, and a second drain electrode, and an interconnection extending in a direction crossing a direction in which the first source electrode, the first gate electrode, and the first drain electrode are arranged, the first MOSFET and the second MOSFET are the same in polarity as each other, and the first drain electrode and the second drain electrode are electrically connected to each other with the interconnection.

According to the buffer circuit related to this application example, even if the selection of the plurality of MOSFETs is changed, it is hard for the total width of the interconnections of the current paths to significantly change. In other words, according to the buffer circuit related to the present application example, even if the drive capability is changed, it is hard for the width of the current path to decrease, and thus, the electromigration resistance can be maintained in good condition. Thus, it is possible for the buffer circuit according to the present application example to operate with high reliability even if the drive capability is changed.

APPLICATION EXAMPLE 5

The buffer circuit according to the application example described above may further include a first switch connected to the second gate electrode.

According to the buffer circuit related to this application example, it is possible to easily change the drive capability.

APPLICATION EXAMPLE 6

A buffer circuit according to this application example of the invention includes a first MOSFET including a first source electrode, a first gate electrode, and a first drain electrode, a second MOSFET including a second source electrode, a second gate electrode, and a second drain electrode, and a third MOSFET including a third source electrode, a third gate electrode, and the first drain electrode, and a fourth MOSFET including a fourth source electrode, a fourth gate electrode, and the second drain electrode, the first MOSFET, the second MOSFET, the third MOSFET, and the fourth MOSFET are the same in polarity as each other, the first gate electrode and the third gate electrode are electrically connected to each other, the second gate electrode and the fourth gate electrode are electrically connected to each other, and the first drain electrode and the second drain electrode are electrically connected to each other with a common interconnection.

According to the buffer circuit related to this application example, even if the selection of the plurality of MOSFETs is changed, it is hard for the total width of the interconnections of the current paths to significantly change. In other words, according to the buffer circuit related to the present application example, even if the drive capability is changed, it is hard for the width of the current path to decrease, and thus, the electromigration resistance can be maintained in good condition. Thus, it is possible for the buffer circuit according to the present application example to operate with high reliability even if the drive capability is changed.

APPLICATION EXAMPLE 7

The buffer circuit according to the application example described above may further include a first switch connected to the second gate electrode and the fourth gate electrode.

According to the buffer circuit related to this application example, it is possible to easily change the drive capability.

APPLICATION EXAMPLE 8

A buffer circuit according to this application example of the invention includes at least two MOSFETs including a first MOSFET and a second MOSFET, an interconnection through which a signal from the MOSFET is transmitted, and an adjuster adapted to select at least one MOSFET from at least two MOSFETs, the adjuster is capable of switching between a first state in which the first MOSFET is selected and the second MOSFET is not selected, and a second state in which both of the first MOSFET and the second MOSFET are selected, and a ratio of a sum of widths of parts to be current paths out of interconnections in the second state to a sum of widths of parts to be current paths out of interconnections in the first state is lower than a ratio of a sum of channel widths of the MOSFETs selected in the second state to a sum of channel widths of the MOSFETs selected in the first state.

According to the buffer circuit related to this application example, even if the selection of the plurality of MOSFETs is changed, it is hard for the total width of the interconnections of the current paths to significantly change. In other words, according to the buffer circuit related to the present application example, even if the drive capability is changed, it is hard for the width of the current path to decrease, and thus, the electromigration resistance can be maintained in good condition. Thus, it is possible for the buffer circuit according to the present application example to operate with high reliability even if the drive capability is changed.

APPLICATION EXAMPLE 9

In the buffer circuit according to the application example described above, the sum of the widths of the parts to be the current paths out of the interconnections may be kept constant between the first state and the second state.

According to the buffer circuit related to this application example, the electromigration resistance can be maintained in good condition. Thus, it is possible for the buffer circuit according to the present application example to operate with high reliability even if the drive capability is changed.

APPLICATION EXAMPLE 10

The buffer circuit according to the application example described above may further include a frequency divider, which is disposed in an anterior stage of the plurality of MOSFETs, and division ratio of which can be selected.

According to the buffer circuit related to this application example, by selecting the division ratio of the frequency divider, it is possible to output a signal having either one of a plurality of types of frequency. Further, since the frequency divider is disposed on the anterior stage instead of the posterior stage of the plurality of MOSFETs, the possibility that the electromigration resistance is deteriorated by the frequency divider is extremely small. Therefore, according to the present application example, it is possible to realize the versatile buffer circuit, which can operate with high reliability even if the drive capability is changed, and which can select the output frequency.

APPLICATION EXAMPLE 11

A semiconductor integrated circuit device according to this application example of the invention includes the buffer circuit according to any one of the application examples described above.

According to this application example, it is possible to realize the integrated circuit device in which it is hard for the total width of the interconnections of the current paths to significantly change even if the selection of the plurality of MOSFETs is changed. In other words, according to the integrated circuit device related to the present application example, even if the drive capability is changed, it is hard for the width of the current path to decrease, and thus, the electromigration resistance can be maintained in good condition. Thus, it is possible to operate with high reliability even if the drive capability is changed.

APPLICATION EXAMPLE 12

An oscillator according to this application example of the invention includes an oscillation element, an oscillation circuit adapted to oscillate the oscillation element, and the buffer circuit according to any one of the application examples described above.

According to this application example, it is possible to realize the oscillator in which it is hard for the total width of the interconnections of the current paths to significantly change even if the selection of the plurality of MOSFETs is changed. In other words, according to the oscillator related to the present application example, even if the drive capability is changed, it is hard for the width of the current path to decrease, and thus, the electromigration resistance can be maintained in good condition. Thus, it is possible to operate with high reliability even if the drive capability is changed.

APPLICATION EXAMPLE 13

An electronic apparatus according to this application example of the invention includes one of the buffer circuit and the oscillator according to any one of the application examples described above.

APPLICATION EXAMPLE 14

A base station according to this application example of the invention includes one of the buffer circuit and the oscillator according to any one of the application examples described above.

According to these application examples, since the buffer circuit high in reliability is included, it is possible to realize the electronic apparatus and the base station operating with high reliability.

BRIEF DESCRIPTION OF THE DRAWINGS

The embodiments of the invention will be described with reference to the accompanying drawings, wherein like numbers reference like elements.

DESCRIPTION OF EXEMPLARY EMBODIMENTS

Hereinafter, some embodiments of the invention will be explained. The embodiments described hereinafter are each for explaining an example of the invention. The invention is not at all limited to the embodiments described below, and includes a variety of types of modified configurations to be put into practice within the scope or the spirit of the invention. It should be noted that all of the constituents explained hereinafter are not necessarily essential elements of the invention.

1. Buffer Circuit

An aspect of the buffer circuit according to the present embodiment is provided with a first MOSFET including a first source electrode, a first gate electrode, and a first drain electrode, a second MOSFET including a second source electrode, a second gate electrode, and a second drain electrode, a third MOSFET including a third source electrode, a third gate electrode, and the first drain electrode, a fourth MOSFET including a fourth source electrode, a fourth gate electrode, and the second drain electrode, wherein the first MOSFET and the second MOSFET are the same in polarity, and the first gate electrode and the second gate electrode are electrically connected to each other.

Hereinafter, as an example in which the buffer circuit according to an embodiment of the invention is incorporated in a part of an output circuit, an oscillator will be explained, and then the buffer circuit, a semiconductor integrated circuit device, and so on will be described.

1.1. Oscillator

Figure 1:
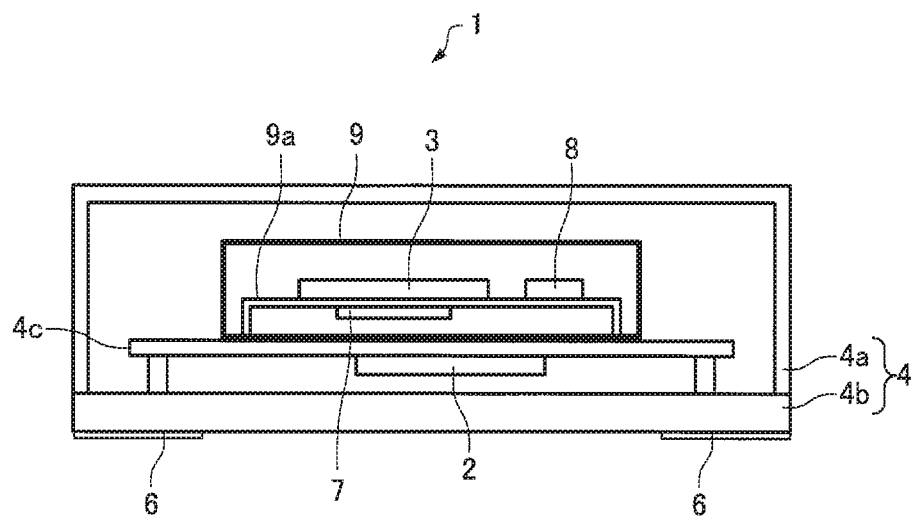
FIG. 1 is a diagram showing an example of a structure of an oscillator according to an embodiment of the invention.

FIG. 1 is a diagram showing an example of a structure of an oscillator according to an embodiment of the invention, and is a cross-sectional view of the oscillator. As shown in FIG. 1, the oscillator 1 according to the present embodiment is configured including an integrated circuit (IC) 2, a resonator 3 (a resonator element), a package 4, external terminals (external electrodes) 6, a heater element 7, and a temperature sensor 8.

The package 4 is constituted by a case 4a and a base 4b bonded to each other. In the internal space of the package 4, there is disposed a component mounting board 4c so as to be opposed to the base 4b, and an oven 9 is mounted on the upper surface of the component mounting board 4c. Further, on a lower surface of the component mounting board 4c, there is mounted the integrated circuit (IC) 2 as the semiconductor integrated circuit device. The resonator 3 and the temperature sensor 8 are mounted on an upper surface of a component mounting board 9a, and the heater element 7 is mounted at the position opposed to the resonator 3 on the lower surface of the component mounting board 9a to thereby be housed in the internal space of the oven 9.

Terminals of the resonator 3, the heater element 7, and the temperature sensor 8 are electrically connected respectively to the specified terminals of the integrated circuit (IC) 2 with a wiring pattern not shown. Further, some of the terminals of the integrated circuit (IC) 2 are electrically connected to the external terminals 6 disposed on a surface of the package 4 with a wiring pattern not shown.

The resonator 3 is formed of a resonator element not shown encapsulated in a package having high airtightness. The resonator element has metal excitation electrodes respectively disposed on the obverse surface and the reverse surface of the resonator element, and the resonator 3 oscillates with a specified frequency corresponding to the thickness of the resonator element including the excitation electrodes.

As the resonator 3, there can be used, for example, a quartz crystal resonator, a surface acoustic wave (SAW) resonator, other piezoelectric resonators, or an MEMS (Micro Electro Mechanical Systems) resonator. As a substrate material of the resonator 3, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation device of the resonator 3, there can be used a device using a piezoelectric effect, or electrostatic drive using a coulomb force.

The heater element 7 is, for example, an element for generating heat in response to a current flowing therethrough, and can be a resistor, a power transistor, a Peltier element, or the like.

The temperature sensor 8 outputs a signal (e.g., a voltage corresponding to the temperature) corresponding to the ambient temperature of the temperature sensor 8. The temperature sensor 8 can also be, for example, a thermistor, a platinum resistance, or a temperature detection circuit using the bandgap of a semiconductor.

Figure 2:
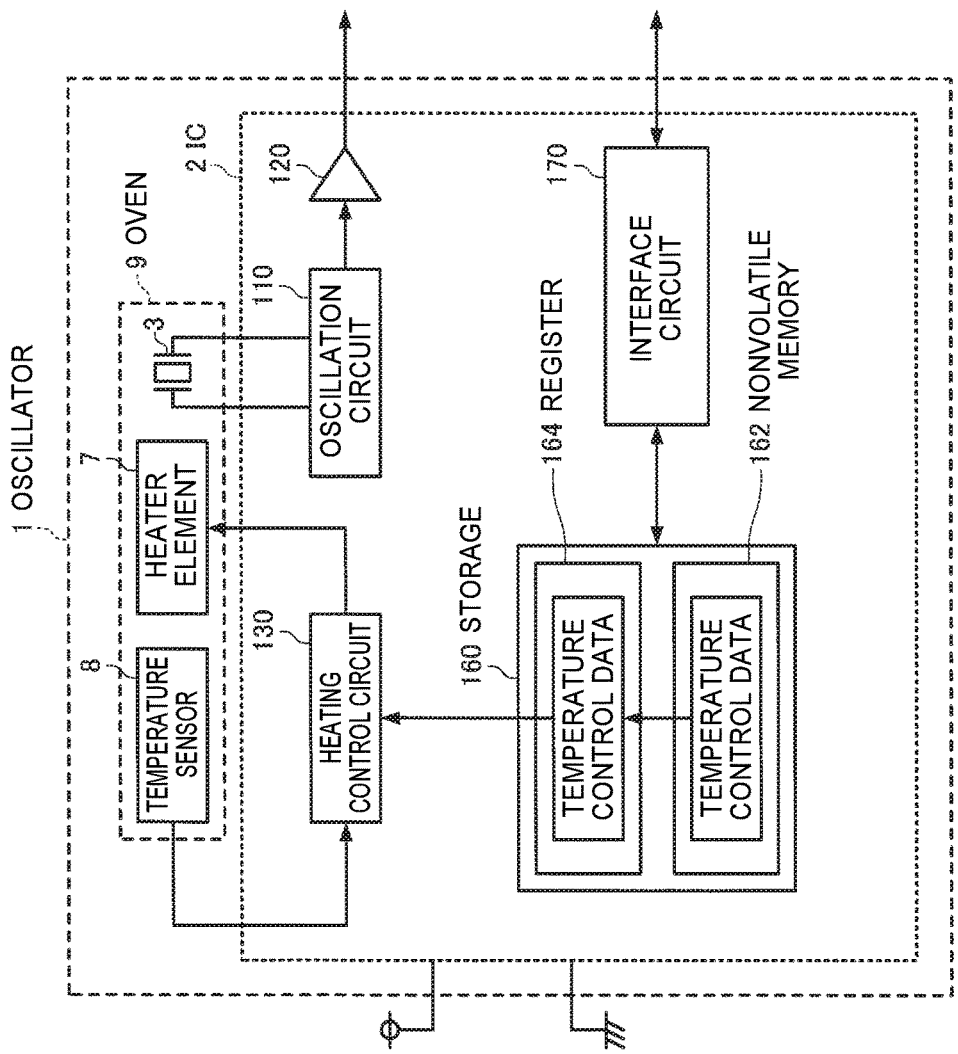
FIG. 2 is a functional block diagram of the oscillator according to the embodiment.

FIG. 2 is a functional block diagram of the oscillator 1 according to the present embodiment. As shown in FIG. 2, the oscillator 1 according to the present embodiment includes the resonator 3, the heater element 7, and the temperature sensor 8 housed in the oven 9, and the integrated circuit (IC) 2 for oscillating the resonator 3, and the integrated circuit (IC) 2, the resonator 3, the heater element 7, and the temperature sensor 8 are housed in the package 4.

In the present embodiment, the integrated circuit (IC) 2 is configured including an oscillation circuit 110, an output circuit 120, a heating control circuit 130, a storage 160, and an interface circuit 170. It should be noted that the integrated circuit (IC) 2 can have a configuration obtained by eliminating or modifying some of these constituents, or adding other constituents. Further, in the present embodiment, the oscillation circuit 110, the output circuit 120, the heating control circuit 130, the storage 160, and the interface circuit 170 are configured as a single integrated circuit (IC), but can also be constituted by two or more integrated circuits (IC). Further, at least a part of the oscillation circuit 110, the output circuit 120, the heating control circuit 130, the storage 160, and the interface circuit 170 is not required to be integrated, and can discretely be configured using, for example, a plurality of electronic components.

The storage 160 has a nonvolatile memory 162 and a register 164, and is configured so that reading from and writing to the nonvolatile memory 162 or the register 164 can be performed from the external terminals 6 via the interface circuit 170. The interface circuit 170 can be an interface circuit compatible with a variety of types of serial bus such as SPI (Serial Peripheral Interface) or I²C (Inter-Integrated Circuit), or can also be an interface circuit compatible with a parallel bus. It should be noted that in order to reduce the number of the external terminals of the oscillator 1 to miniaturize the package 4, it is desirable to configure the interface circuit 170 as an interface circuit compatible with the serial bus.

The nonvolatile memory 162 is a storage for storing a variety of types of control data, and is configured as a programmable ROM (PROM) to which data can be written. The nonvolatile memory 162 can be a variety of types of rewritable memory such as an EEPROM, or can also be a variety of types of non-rewritable (write once) memory such as a one-time PROM.

The nonvolatile memory 162 stores temperature control data for controlling the heating control circuit 130. The temperature control data is, for example, the data for setting the internal temperature (the temperature of the resonator 3) of the oven 9, and can also be the data of a threshold voltage to be compared with the output voltage of the temperature sensor 8 in order to control the heat generation of the heater element 7. If the resonator 3 is an SC-cut quartz crystal resonator, the frequency-temperature characteristic exhibits a quadratic curve, and the frequency variation per unit temperature is the smallest in the vicinity of the peak of the quadratic curve. Therefore, for example, the temperature control data can also be the data for setting the internal temperature of the oven 9 so that the temperature of the resonator 3 becomes the temperature in the vicinity of the peak. It should be noted that the nonvolatile memory 162 can also store control data for the oscillation circuit 110 and the output circuit 120.

Each of the data stored in the nonvolatile memory 162 is transferred from the nonvolatile memory 162 to the register 164 when powering on (when the voltage between the power terminals rises from 0 V to a specified voltage) the integrated circuit (IC) 2, and is then held in the register 164. Thus, the temperature control data held in the register 164 is input to the heating control circuit 130.

In the case in which the nonvolatile memory 162 is non-rewritable (write once), in the manufacturing process (an inspection process) of the oscillator 1, each of the data is directly written into the register 164 from the external terminals 6 via the interface circuit 170 to be adjusted/selected so that the oscillator 1 fulfills the specified characteristic, and then each of the data thus adjusted/selected is finally written into the nonvolatile memory 162. In the case in which the nonvolatile memory 162 is rewritable, it is also possible to arrange that each of the data is written into the nonvolatile memory 162 from the external terminals 6 via the interface circuit 170 in the manufacturing process (the inspection process) of the oscillator 1. It should be noted that since writing to the nonvolatile memory 162 generally takes time, in order to shorten the inspection time of the oscillator 1, it is also possible to arrange that each of the data is directly written into the register 164 from the external terminals 6 via the interface circuit 170, and each of the data adjusted/selected is finally written into the nonvolatile memory 162.

The oscillation circuit 110 amplifies the output signal of the resonator 3 to feed back the result to the resonator 3 to thereby oscillate the resonator 3, and then outputs a frequency signal (an oscillation signal) based on the oscillation of the resonator 3.

As the oscillation circuit 110, there can be adopted a circuit having a known variety of types of configurations, and the circuit constituted by the oscillation circuit 110 and the resonator 3 can also be a variety of types of circuit such as a pierce oscillator circuit, an inverter type oscillation circuit, a Colpitts oscillator circuit, or a Hartley oscillator circuit. For example, the oscillation stage current of the oscillation circuit 110 can be controlled by the control data held in the register 164.

The frequency signal (the oscillation signal) output by the oscillation circuit 110 is input to the output circuit 120, and the output circuit 120 generates a frequency signal (an oscillation signal) for an external output, and then outputs the frequency signal to the outside via the external terminals 6. The output circuit 120 can be, for example, a buffer circuit. Further, it is also possible for the output circuit 120 to include a constituent for dividing the frequency of the frequency signal (the oscillation signal) output by the oscillation circuit 110, and then outputting the oscillation signal thus divided. For example, the division ratio of the frequency signal (the oscillation signal) in the output circuit 120 can be controlled by the control data held in the register 164.

An output signal from the temperature sensor 8 is input to the heating control circuit 130, and the heating control circuit 130 generates a heating control signal. The heating control signal is a signal for controlling the heat generation of the heater element 7, and the heating control circuit 130 controls the heat generation of the heater element 7 so that the output signal of the temperature sensor 8 is kept at the specified voltage value corresponding to the temperature control data held in the register 164. Thus, the internal temperature (the temperature of the resonator 3) of the oven 9 is controlled so as to be roughly constant irrespective of the ambient temperature of the oscillator 1.

The heater element 7 is controlled in the heat generation value based on the heating control signal output by the heating control circuit 130, and heats the resonator 3. It is also possible to arrange that, for example, the heater element 7 varies in heat generation value in accordance with the amount of the electric current, and the amount of the current flowing through the heater element 7 is controlled based on the heating control signal.

The oscillator 1 according to the present embodiment configured as described above functions as an oven controlled oscillator (oven controlled crystal oscillator (OCXO) if the resonator 3 is a quartz crystal resonator) for outputting the frequency signal (the oscillation signal) with a frequency extremely stable irrespective of the temperature in the specified temperature range in which the operation of the oscillator 1 is guaranteed. In particular, by using the SC-cut quartz crystal resonator as the resonator 3, and setting the temperature control data so that the temperature of the resonator 3 becomes the temperature in the vicinity of the peak, it is possible to realize the oven controlled oscillator extremely high in frequency stability.

1.2. Buffer Circuit

The buffer circuit according to the embodiment of the invention can be realized as, for example, at least a part of the semiconductor integrated circuit device, and can be incorporated in a variety of types of electronic apparatus or the like. For example, the buffer circuit according to the embodiment of the invention can be incorporated in the oscillator described above as an example. Hereinafter, an example of adopting the buffer circuit 200 according to the present embodiment in the output circuit 120 of the oscillator 1 described above.

1.2.1. Operation of Buffer Circuit

Figure 3:
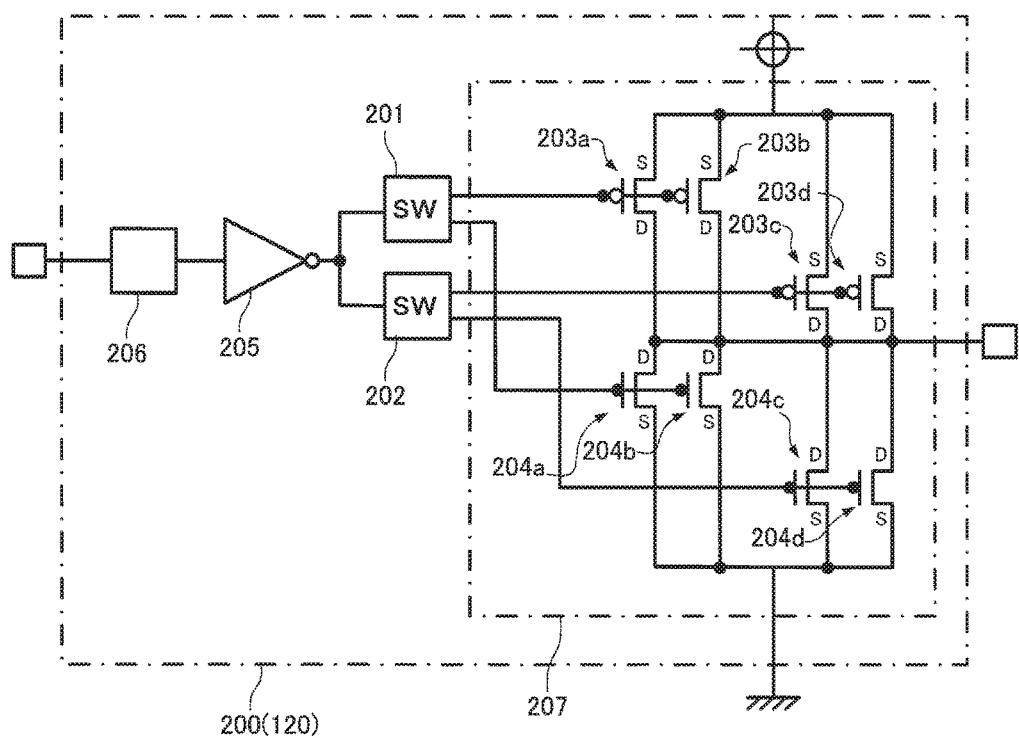
FIG. 3 is a circuit diagram showing the oscillator according to the embodiment.

FIG. 3 is a circuit diagram showing the buffer circuit 200 according to the present embodiment. As shown in FIG. 3, the output circuit 120 is constituted by the buffer circuit 200. Further, in the present embodiment, the buffer circuit 200 is configured including a first switch 201, a second switch 202, four P-channel type MOSFETs (P-channel type metal oxide semiconductor field effect transistors; hereinafter also referred to as P-MOSFETs) 203a, 203b, 203c, and 203d, four N-channel type MOSFETs (N-channel type metal oxide semiconductor field effect transistors; hereinafter also referred to as N-MOSFETs) 204a, 204b, 204c, and 204d, an inverter circuit 205, and a frequency divider circuit 206 (an example of a frequency divider). It should be noted that the buffer circuit 200 can have a configuration obtained by eliminating or modifying some of these constituents, or adding other constituents.

The frequency divider circuit 206 (an example of the frequency divider) is disposed in an anterior stage of the four P-MOSFETs 203a, 203b, 203c, and 203d (an example of a plurality of MOSFET) or the four N-MOSFETs 204a, 204b, 204c, and 204d (an example of the plurality of MOSFET), and is capable of selecting the division ratio. Specifically, the frequency divider circuit 206 generates an oscillation signal obtained by dividing an oscillation signal, which is output by the oscillation circuit 110 and is then input to the output circuit 120 (the buffer circuit 200), at the division ratio corresponding to the control data stored in the storage 160, and then outputs the results. By setting the division ratio of the frequency divider circuit 206 to the storage 160, it becomes possible to select the output frequency of the oscillator 1 out of a plurality of frequencies in accordance with the intended use.

The oscillation signal output by the frequency divider circuit 206 is input to the inverter circuit 205, and the inverter circuit 205 outputs the oscillation signal reversed in the polarity (a high level or a low level) (the logic level).

The oscillation signal output by the inverter circuit 205 is input commonly to the respective gate electrodes of the P-MOSFET 203a, the P-MOSFET 203b, the N-MOSFET 204a, and the N-MOSFET 204b via the first switch 201.

Further, the oscillation signal output by the inverter circuit 205 is input commonly to the respective gate electrodes of the P-MOSFET 203c, the P-MOSFET 203d, the N-MOSFET 204c, and the N-MOSFET 204d via the second switch 202.

The ON state or the OFF state of the first switch 201 and the ON state or the OFF state of the second switch 202 are selected independently of each other in accordance with the control data stored in the storage 160. Therefore, either one of the four states, namely the state in which the first switch 201 and the second switch 202 are both in the OFF state, the state in which only the first switch 201 is in the ON state, the state in which only the second switch 202 is in the ON state, and the state in which the first switch 201 and the second switch 202 are both in the ON state, can be selected.

Figure 4:
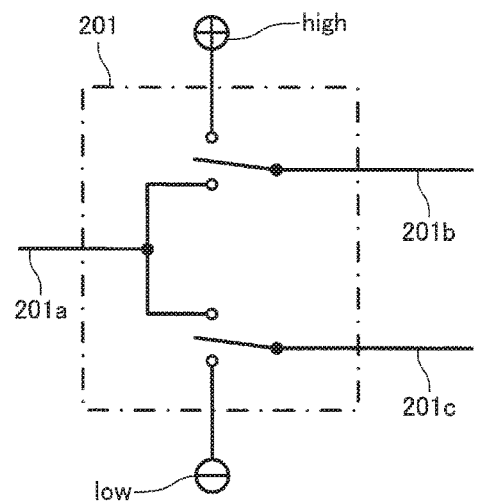
FIG. 4 is a circuit diagram showing a switch used for the oscillator according to the embodiment.

Here, the ON state and the OFF state of the first switch 201 will be described. FIG. 4 shows an example of a circuit diagram of the first switch 201. The first switch 201 has at least an interconnection 201a, an interconnection 201b, and an interconnection 201c. The interconnection 201a is connected to an output of the inverter circuit 205 (see FIG. 3). The interconnection 201b is connected to the gate electrode of the P-MOSFET 203a and the gate electrode of the P-MOSFET 203b (see FIG. 3). Further, the interconnection 201c is connected to the gate electrode of the N-MOSFET 204a and the gate electrode of the N-MOSFET 204b. It should be noted that it is sufficient for the first switch 201 to be connected to the gate electrode of at least one of the MOSFET as long as the buffer circuit 200 fulfills the function of the embodiment.

In the state in which the first switch 201 is in the ON state the interconnection 201a, the interconnection 201b, and the interconnection 201c are connected to each other. Therefore, in the ON state, the interconnection 201b and the interconnection 201c are set to the output potential of the inverter circuit 205.

In contrast, in the state in which the first switch 201 is in the OFF state, the interconnection 201a, the interconnection 201b, and the interconnection 201c are separated from each other, the interconnection 201b is connected to a power supply having a high-level voltage, and the interconnection 201c is connected to a power supply having a low-level voltage.

It should be noted that in the case in which the interconnection 201a, interconnection 201b, and the interconnection 201c are not connected respectively to the high-level power supply and the low-level power supply in the separated state, the interconnection 201b and the interconnection 201c are each set to a floating potential. If each of the MOSFETs thus connected can perform a predetermined operation even in this state, the high-level power supply and the low-level power supply are not necessarily required.

Although the illustration and the description are omitted, the second switch 202 can be configured similarly to the first switch 201.

In the case in which only the first switch 201 is in the ON state (the second switch 202 is in the OFF state), when the output signal of the inverter circuit 205 is in the low level, the source electrode (S) and the drain electrode (D) of the P-MOSFET 203a are electrically connected to each other, and an electric current flows from the power supply toward the output terminal of the output circuit 120 via the source electrode (S) and the drain electrode (D). Similarly, the source electrode (S) and the drain electrode (D) of the P-MOSFET 203b are electrically connected to each other, and an electric current flows from the power supply toward the output terminal of the output circuit 120 via the source electrode (S) and the drain electrode (D). Further, when the output signal of the inverter circuit 205 is in the high level, the source electrode (S) and the drain electrode (D) of the N-MOSFET 204a are electrically connected to each other, and an electric current flows from the output terminal of the output circuit 120 to the ground via the drain electrode (D) and the source electrode (S). Similarly, the source electrode (S) and the drain electrode (D) of the N-MOSFET 204b are electrically connected to each other, and an electric current flows from the output terminal of the output circuit 120 to the ground via the drain electrode (D) and the source electrode (S).

It should be noted that when the second switch 202 is in the OFF state, since the gate electrode of the P-MOSFET 203c and the gate electrode of the P-MOSFET 203d are set to the high level due to a pull-up resistor not shown, the source electrode (S) and the drain electrode (D) of the P-MOSFET 203c are not electrically connected to each other, and the source electrode (S) and the drain electrode (D) of the P-MOSFET 203d are not electrically connected to each other. Similarly, when the second switch 202 is in the OFF state, since the gate electrode of the N-MOSFET 204c and the gate electrode of the N-MOSFET 204d are set to the low level due to a pull-down resistor not shown, the source electrode (S) and the drain electrode (D) of the N-MOSFET 204c are not electrically connected to each other, and the source electrode (S) and the drain electrode (D) of the N-MOSFET 204d are not electrically connected to each other.

Further, in the case in which only the second switch 202 is in the ON state (the first switch 201 is in the OFF state), when the output signal of the inverter circuit 205 is in the low level, the source electrode (S) and the drain electrode (D) of the P-MOSFET 203c are electrically connected to each other, and an electric current flows from the power supply toward the output terminal of the output circuit 120 via the source electrode (S) and the drain electrode (D). Similarly, the source electrode (S) and the drain electrode (D) of the P-MOSFET 203d are electrically connected to each other, and an electric current flows from the power supply toward the output terminal of the output circuit 120 via the source electrode (S) and the drain electrode (D). Further, when the output signal of the inverter circuit 205 is in the high level, the source electrode (S) and the drain electrode (D) of the N-MOSFET 204c are electrically connected to each other, and an electric current flows from the output terminal of the output circuit 120 to the ground via the drain electrode (D) and the source electrode (S). Similarly, the source electrode (S) and the drain electrode (D) of the N-MOSFET 204d are electrically connected to each other, and an electric current flows from the output terminal of the output circuit 120 to the ground via the drain electrode (D) and the source electrode (S).

It should be noted that when the first switch 201 is in the OFF state, since the gate electrode of the P-MOSFET 203a and the gate electrode of the P-MOSFET 203b are set to the high level due to a pull-up resistor not shown, the source electrode (S) and the drain electrode (D) of the P-MOSFET 203a are not electrically connected to each other, and the source electrode (S) and the drain electrode (D) of the P-MOSFET 203b are not electrically connected to each other. Similarly, when the first switch 201 is in the OFF state, since the gate electrode of the N-MOSFET 204a and the gate electrode of the N-MOSFET 204b are set to the low level due to a pull-down resistor not shown, the source electrode (S) and the drain electrode (D) of the N-MOSFET 204a are not electrically connected to each other, and the source electrode (S) and the drain electrode (D) of the N-MOSFET 204b are not electrically connected to each other.

Further, in the case in which both of the first switch 201 and the second switch 202 are in the ON state, when the output signal of the inverter circuit 205 is in the low level, all of the source electrodes (S) and the drain electrodes (D) of the four P-MOSFETs 203a, 203b, 203c, and 203d are electrically connected to each other, and an electric current flows from the power supply toward the output terminal of the output circuit 120 via all of the source electrodes (S) and the drain electrodes (D). Further, when the output signal of the inverter circuit 205 is in the high level, all of the source electrodes (S) and the drain electrodes (D) of the four N-MOSFETs 204a, 204b, 204c, and 204d are electrically connected to each other, and an electric current flows from the output terminal of the output circuit 120 to the ground via all of the drain electrodes (D) and the source electrodes (S).

Further, in the case in which both of the first switch 201 and the second switch 202 are in the OFF state, since the source electrode (S) and the drain electrode (D) of each of the four P-MOSFETs 203a, 203b, 203c, and 203d are not electrically connected to each other, and the source electrode (S) and the drain electrode (D) of each of the four N-MOSFETs 204a, 204b, 204c, and 204d are not electrically connected to each other, the electric current does not flow.

As described above, in the case in which at least one of the first switch 201 and the second switch 202 is in the ON state, the four P-MOSFETs 203a, 203b, 203c, and 203d and the four N-MOSFETs 204a, 204b, 204c, and 204d constitute an inverter circuit 207. The inverter circuit 207 outputs the oscillation signal obtained by reversing the polarity (the high level or the low level) of the oscillation signal output by the inverter 205.

Here, it is assumed that in the case in which at least either one of the first switch 201 and the second switch 202 is in the ON state, the sum of the currents flowing through the respective four P-MOSFETs 203a, 203b, 203c, and 203d is a value I1 roughly constant corresponding to the load connected to the output terminal of the output circuit 120, and the four P-MOSFETs 203a, 203b, 203c, and 203d are all equal in WG/LG (described later) of the gate electrode to each other. Therefore, in the case in which only the first switch 201 is in the ON state, the current of I1/2 flows through each of the two P-MOSFETs 203a, 203b. Further, in the case in which only the second switch 202 is in the ON state, the current of I1/2 flows through each of the two P-MOSFETs 203c, 203d.

Further, in the case in which both of the first switch 201 and the second switch 202 are in the ON state, the current of I1/4 flows through each of the four P-MOSFETs 203a, 203b, 203c, and 203d. Therefore, in the case in which only the first switch 201 is in the ON state, it results that the electric current, which is twice as high as that in the case in which both of the first switch 201 and the second switch 202 are in the ON state, flows through the two P-MOSFETs 203a, 203b. Similarly, in the case in which only the second switch 202 is in the ON state, it results that the electric current, which is twice as high as that in the case in which both of the first switch 201 and the second switch 202 are in the ON state, flows through the two P-MOSFETs 203c, 203d.

Although the detailed explanation is omitted, in the case in which only the first switch 201 is in the ON state, it results that the electric current, which is twice as high as that in the case in which both of the first switch 201 and the second switch 202 are in the ON state, also flows through the two N-MOSFETs 204a, 204b. Similarly, in the case in which only the second switch 202 is in the ON state, it results that the electric current, which is twice as high as that in the case in which both of the first switch 201 and the second switch 202 are in the ON state, also flows through the two N-MOSFETs 204c, 204d.

Therefore, if a common drain electrode is shared by the drain electrode of the P-MOSFET 203a and the drain electrode of the P-MOSFET 203b, and a common drain electrode is shared by the drain electrode of the P-MOSFET 203c and the drain electrode of the P-MOSFET 203d in order to reduce the layout area, in the case in which only either one of the first switch 201 and the second switch 202 is in the ON state, it results that an electric current, which is twice as high as that in the case in which both of the first switch 201 and the second switch 202 are in the ON state, flows into each of these common drain electrodes. Therefore, in the case in which only either one of the first switch 201 and the second switch 202 is in the ON state, it results that metal interconnections connected to these common drain electrodes are relatively easily broken due to electromigration. Similarly, if a common drain electrode is shared by the drain electrode of the N-MOSFET 204a and the drain electrode of the N-MOSFET 204b, and a common drain electrode is shared by the drain electrode of the N-MOSFET 204c and the drain electrode of the N-MOSFET 204d, in the case in which only either one of the first switch 201 and the second switch 202 is in the ON state, it results that metal interconnections connected to these common drain electrodes are relatively easily broken due to electromigration.

In contrast, in the buffer circuit 200 according to the present embodiment, by devising the selection of the drain electrodes sharing the common electrodes, namely by devising the arrangement (layout) of the MOSFETs, such a circumstance as described above is avoided while reducing the layout area to make the metal interconnections connected to the common drain electrodes hard to be broken due to electromigration. Hereinafter, a specific layout of the buffer circuit 200 in the semiconductor integrated circuit device will be described.

It should be noted that in the present specification, the "electromigration resistance" denotes the maximum value of the amount of the current not causing the electromigration, and is a value roughly proportional to the interconnection width WI (interconnection cross-sectional area S1).

1.2.2. Layout of Buffer Circuit

A specific example of disposing the buffer circuit 200 according to the embodiment on a semiconductor substrate (e.g., a silicon substrate or a GaAs substrate) will be described.

Figure 5:
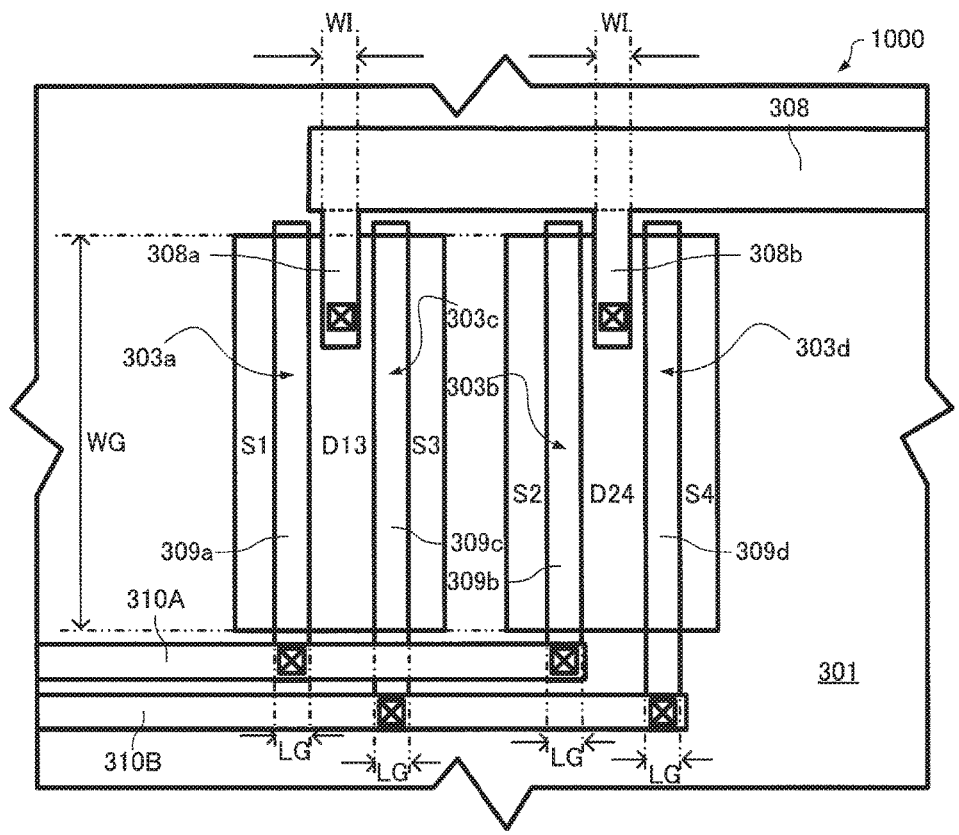
FIG. 5 is a schematic planar view of a semiconductor integrated circuit according to the embodiment.

FIG. 5 is a schematic planar view of a semiconductor integrated circuit device 1000 as an example of the layout of the semiconductor integrated circuit having the four P-MOSFETs 203a, 203b, 203c, and 203d of the buffer circuit 200 according to the present embodiment arranged in a part on a substrate 301.

The semiconductor integrated circuit device 1000 has P-MOSFETs 303a, 303b, 303c, and 303d corresponding respectively to the four P-MOSFETs 203a, 203b, 203c, and 203d described above. Further, the semiconductor integrated circuit device 1000 has an interconnection 308 electrically connected to a drain (D13) shared by the two P-MOSFETs 303a, 303c and a drain (D24) shared by the two P-MOSFETs 303b, 303d. The interconnection 308 is an electrically-conducting path extracted from each of the drain electrode D13 and the drain electrode D24, and is formed of an extraction interconnection 308a and an extraction interconnection 308b joined with each other.

The extraction interconnection 308a and the extraction interconnection 308b have the same interconnection width WI in the present embodiment. The extraction interconnection 308a and the extraction interconnection 308b form current paths through which the drain currents of the respective MOSFETs flow.

Further, the semiconductor integrated circuit device 1000 has gate electrodes 309a, 309b, 309c, and 309d of the respective four P-MOSFETs 303a, 303b, 303c, and 303d. Further, the semiconductor integrated circuit device 1000 has an interconnection 310A commonly connected to the gate electrode 309a and the gate electrode 309b out of the four gate electrodes 309a, 309b, 309c, and 309d, and an interconnection 310B commonly connected to the gate electrode 309c and the gate electrode 309d.

Further, the interconnection 310A is connected to a switch A (corresponding to the first switch 201 described above) not shown, and the interconnection 310B is connected to a switch B (corresponding to the second switch 202 described above) not shown. It should be noted that interconnections not shown are connected to the source electrodes (specifically an impurity diffused layers) of the respective MOSFETs.

It should be noted that in the present embodiment, as shown in FIG. 5, the extraction interconnections 308a, 308b electrically connected respectively to the drain (D) shared by the two P-MOSFETs 303a, 303c and the drain (D) shared by the two P-MOSFETs 303b, 303d are formed to have the same width, and the width is defined as the interconnection width WI. Further, the width in the longitudinal direction of the gate electrodes 309a, 309b, 309c, and 309d is defined as a channel width WG, and the width in the short-side direction of the gate electrodes is defined as a gate length LG.

In other words, it can be said that the semiconductor integrated circuit device 1000 is provided with a first MOSFET 303a including a first source electrode S1, a first gate electrode 309a, and a first drain electrode D13, a second MOSFET 303b including a second source electrode S2, a second gate electrode 309b, and a second drain electrode D24, a third MOSFET 303c including a third source electrode S3, a third gate electrode 309c, and the first drain electrode D13 shared with the first MOSFET 303a, and a fourth MOSFET 303d including a fourth source electrode S4, a fourth gate electrode 309d, and the second drain electrode D24 shared with the second MOSFET 303b. Further, the first MOSFET 303a and the second MOSFET 303b are the same in polarity (the P-channel type), the first gate electrode 309a and the second gate electrode 309b are electrically connected to each other, and the third gate electrode 309c and the fourth gate electrode 309d are electrically connected to each other.

Comparison with Related-Art Example

Hereinafter, the layout of the semiconductor integrated circuit device 1000 according to the present embodiment will be described while being compared with the layout of the related-art example.

Figure 12:
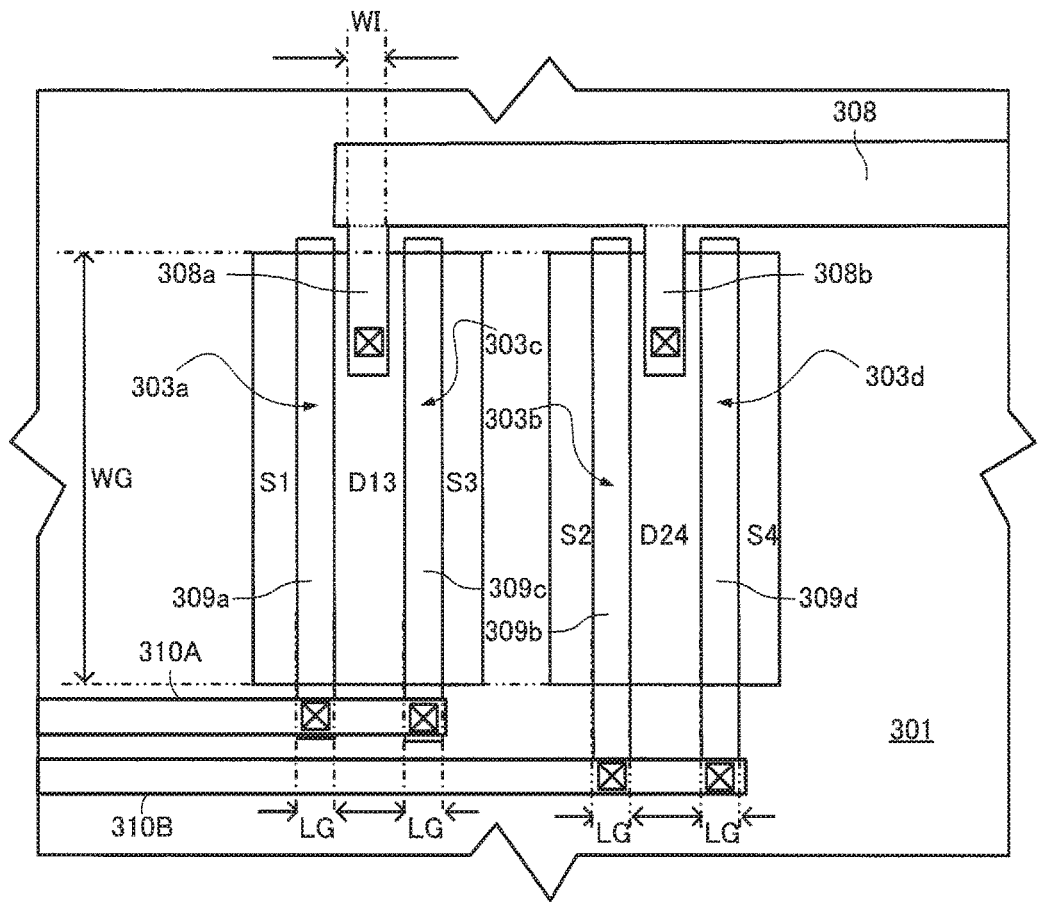
FIG. 12 is a schematic planar view of a semiconductor integrated circuit according to a related art example.

FIG. 12 is a schematic planar view showing the layout on the substrate 301 of the four P-MOSFETs 203a, 203b, 203c, and 203d of the buffer circuit formed in the semiconductor integrated circuit device of the related-art example. In FIG. 12, there are drawn the P-MOSFETs 303a, 303b, 303c, and 303d corresponding respectively to the four P-MOSFETs 203a, 203b, 203c, and 203d of the buffer circuit 200 described above.

For the sake of comparison, in the related-art layout shown in FIG. 12, substantially the same reference symbols as in the layout of the present embodiment described above are attached. Specifically, the semiconductor integrated circuit device has the interconnection 308 electrically connected to a drain (D) shared by the two P-MOSFETs 303a, 303c and a drain (D) shared by the two P-MOSFETs 303b, 303d. Further, in the related-art example shown in FIG. 12, the semiconductor integrated circuit device also has gate electrodes 309a, 309b, 309c, and 309d of the respective four P-MOSFETs 203a, 203b, 203c, and 203d.

However, in the related-art example, the semiconductor integrated circuit device has the interconnection 310A commonly connected to the gate electrode 309a and the gate electrode 309c out of the four gate electrodes 309a, 309b, 309c, and 309d, and the interconnection 310B commonly connected to the gate electrode 309b and the gate electrode 309d. Further, the interconnection 310A is connected to the switch A (corresponding to the first switch 201 described above) not shown, and the interconnection 310B is connected to the switch B (corresponding to the second switch 202 described above) not shown.

Here, there is considered the case in which only either one of the switch A and the switch B is in the ON state. As already described, the sum of the currents flowing through the four P-MOSFETs 303a, 303b, 303c, and 303d is the value I1 roughly constant corresponding to the load connected to the output terminal of the output circuit 120. It should be noted that it is also assumed here that the four P-MOSFETs 303a, 303b, 303c, and 303d are all equal in WG/LG of the gate electrode to each other.

In the semiconductor integrated circuit device 1000 according to the present embodiment, in the case in which only the switch A (the first switch 201) is in the ON state, a voltage is applied to the interconnection 310A, and the MOSFET 303a and the MOSFET 303b operate to electrically connect the source S1 and the drain D13 to each other, and electrically connect the source S2 and the drain D24 to each other. On this occasion, the value of the current flowing through the interconnection 308 becomes I1, and the current flows through the two current paths, namely the two extraction interconnections 308a, 308b. Therefore, the total width of the current paths on this occasion becomes 2×WI.

In contrast, in the semiconductor integrated circuit device (FIG. 12) of the related-art example, in the case in which only the switch A (the first switch 201) is in the ON state, a voltage is applied to the interconnection 310A, and the MOSFET 303a and the MOSFET 303c operate to electrically connect the source S1 and the drain D13 to each other, and electrically connect the source S3 and the drain D13 to each other. On this occasion, the value of the current flowing through the interconnection 308 becomes I1, and the current flows through the single current path, namely the single extraction interconnection 308a. Therefore, the total width of the current paths becomes WI.

In the case in which only the switch A (the first switch 201) is in the ON state, focusing attention on the extraction interconnection 308a, the current with the current value I1 flows in the semiconductor integrated circuit device of the related-art example on the one hand, only the current with the current value I1/2 flows in the semiconductor integrated circuit device 1000 according to the present embodiment on the other hand. In other words, it results that in the semiconductor integrated circuit device 1000 according to the present embodiment, there flows only the current half as high as that in the semiconductor integrated circuit device of the related-art example. Such a relationship of the magnitude of the current also applies to the extraction interconnection 308b in the case in which only the switch B (the second switch 202) is in the ON state.

Therefore, in the case in which only either one of the switch A and the switch B is in the ON state, it results that the extraction interconnections connected to these common drain electrodes are relatively hard to be broken due to the electromigration in the semiconductor integrated circuit device 1000 according to the present embodiment.

Further, in the case in which both of the switch A and the switch B are in the ON state, since all of the MOSFETs 303a, 303b, 303c, and 303d operate in either of the semiconductor integrated circuit device 1000 according to the present embodiment and the semiconductor integrated circuit device of the related-art example (FIG. 12), the current with the current value I1 flowing through the interconnection 308 flows through the two current paths, namely the two extraction interconnections 308a, 308b. Therefore, the total width of the current paths on this occasion becomes 2×WI, and the current with the current value I1 flows through either of the extraction interconnections 308a, 308b.

Therefore, in the semiconductor integrated circuit device 1000 according to the present embodiment, since the value of the current flowing through each of the extraction electrodes 308a, 308b hardly varies between the case in which either one of the switch A and the switch B is in the ON state and the case in which both are in the ON state, it results that the breakage due to the electromigration is hard to occur irrespective of the selection of the switch A and the switch B.

A similar effect will be described focusing attention on the electromigration resistance (EM resistance). Here, the EM resistance of one extraction interconnection (interconnection width WI) is defined as I2. In the semiconductor integrated circuit device (FIG. 12) of the related-art example, in the case in which only either one of the switch A and the switch B is in the ON state, since only either one of the extraction interconnections 308a, 308b becomes the current path, the value I1 of the current flowing through the extraction interconnection 308a or the extraction interconnection 308b is required to be equal to or lower than I2. In contrast, in the semiconductor integrated circuit device 1000 according to the present embodiment, since both of the extraction interconnections 308a, 308b become the current paths in either of the case in which only either one of the switch A and the switch B is in the ON state, and the case in which both are in the ON state, it is sufficient for the value I1/2 of the current flowing through the extraction interconnection 308a or the extraction interconnection 308b to be equal to or lower than 12. In other words, the upper limit of the acceptable amount of the current I1 flowing through the interconnection 308 becomes equal to or lower than 2×I2 in either of the case in which either one of the switch A and the switch B is in the ON state and the case in which both are in the ON state.

Therefore, in view of the EM resistance, in the semiconductor integrated circuit device 1000 according to the present embodiment, even in the case in which only either one of the switch A and the switch B is in the ON state, it is possible to make the same current as in the case in which both of the switch A and the switch B are in the ON state, namely a higher current than in the semiconductor integrated circuit device (FIG. 12) in the related-art example, flow through the interconnection 308.

It should be noted that although the P-MOSFET part of the buffer circuit 200 is described hereinabove, the same as above applies to the N-MOSFET part.

1.2.2. Modified Examples of Layout of Buffer Circuit
1.2.2.1. Example with Single Pair of MOSFETs Sharing Common Drain In the embodiment described above, an example in which both of the two pairs of P-MOSFETs form the common drains is shown for the sake of convenience of explanation. However, it will be understood that substantially the same advantage can be obtained in the case in which there exists a single pair of MOSFETs sharing the common drain.

Figure 6:
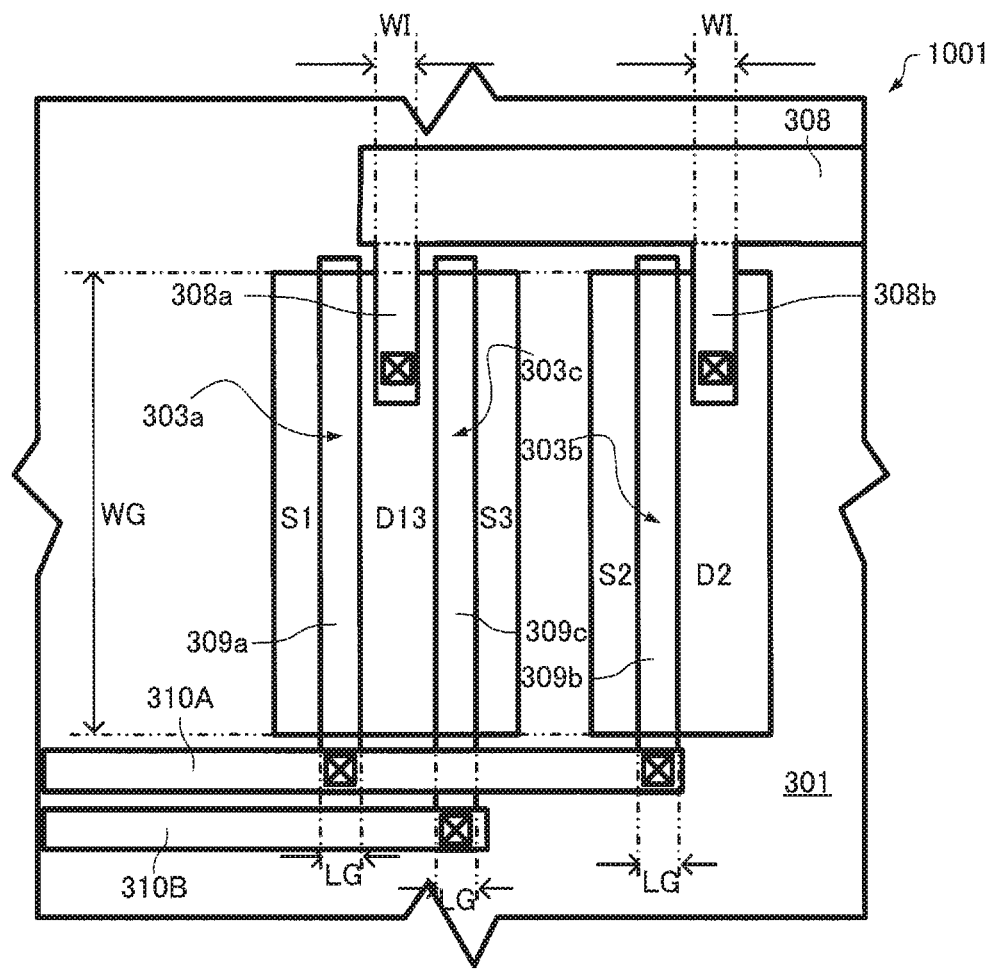
FIG. 6 is a schematic planar view of a semiconductor integrated circuit according to a modified embodiment of the invention.

FIG. 6 is a schematic planar view showing an example of the layout of a semiconductor integrated circuit device 1001 according to a modified embodiment having the three P-MOSFETs 203a, 203b, and 203c, out of the four P-MOSFETs 203a, 203b, 203c, and 203d of the buffer circuit 200 arranged in a part on the substrate 301. It should be noted that in the present modified embodiment, any three of the four P-MOSFETs 203a, 203b, 203c, and 203d of the buffer circuit 200 can be selected.

The semiconductor integrated circuit device 1001 has the P-MOSFETs 303a, 303b, and 303c corresponding respectively to the three P-MOSFETs 203a, 203b, and 203c.

In FIG. 6, the members exerting substantially the same actions and functions as those of the semiconductor integrated circuit device 1000 described above will be denoted by the same reference symbols, and the explanation thereof will be omitted.

The semiconductor integrated circuit device 1001 has the interconnection 308 electrically connected to the drain D13 shared by the two P-MOSFETs 303a, 303c and a drain D2 shared of the P-MOSFET 303b. The interconnection 308 is an electrically-conducting path extracted while connecting both of the drain electrode D13 and the drain electrode D2 to each other, and is formed of the extraction interconnection 308a and the extraction interconnection 308b joined with each other. Further, in the semiconductor integrated circuit device 1001, from a viewpoint of the drain electrode, the extraction interconnection 308a and the extraction interconnection 308b constitute two electrically-conducting paths.

The extraction interconnection 308a and the extraction interconnection 308b have the same interconnection width WI. The extraction interconnection 308a and the extraction interconnection 308b form current paths through which the drain currents of the respective MOSFETs flow.

Further, the semiconductor integrated circuit device 1001 has the gate electrodes 309a, 309b, and 309c of the respective three P-MOSFETs 303a, 303b, and 303c. Further, the semiconductor integrated circuit device 1001 has the interconnection 310A commonly connected to the gate electrode 309a and the gate electrode 309b out of the three gate electrodes 309a, 309b, and 309c, and the interconnection 310B connected to the gate electrode 309c.

Further, the interconnection 310A is connected to the switch A (the first switch 201 described above) not shown, and the interconnection 310B is connected to the switch B (the second switch 202 described above) not shown. It should be noted that interconnections not shown are connected to the source electrodes (S) of the respective MOSFETs.

In other words, the semiconductor integrated circuit device 1001 is provided with the first MOSFET 303a including the first source electrode S1, the first gate electrode 309a, and the first drain electrode D13, the second MOSFET 303b including the second source electrode S2, the second gate electrode 309b, and the second drain electrode D2, and the third MOSFET 303c including the third source electrode S3, the third gate electrode 309c, and the first drain electrode D13, and the first MOSFET 303a and the second MOSFET 303b are the same in polarity. Further, the first gate electrode 309a and the second gate electrode 309b are electrically connected to each other.

Similarly to the embodiment described above, there is considered the case in which only either one of the switch A and the switch B is in the ON state. As already described, the sum of the currents flowing through the three P-MOSFETs 303a, 303b, and 303c is the value I1 roughly constant corresponding to the load connected to the output terminal of the output circuit 120. It should be noted that it is also assumed here that the three P-MOSFETs 303a, 303b, and 303c are all equal in WG/LG of the gate electrode to each other.

In the semiconductor integrated circuit device 1001 according to the present modified embodiment, in the case in which only the switch A (the first switch 201) is in the ON state, a voltage is applied to the interconnection 310A, and the MOSFET 303a and the MOSFET 303b operate to electrically connect the source S1 and the drain D13 to each other, and electrically connect the source S2 and the drain D2 to each other. On this occasion, the value of the current flowing through the interconnection 308 becomes I1, and the current flows through the two current paths, namely the two extraction interconnections 308a, 308b. Therefore, the total width of the current paths on this occasion becomes 2×WI.

In contrast, in the semiconductor integrated circuit device (FIG. 12) of the related-art example, in the case in which only the switch A (the first switch 201) is in the ON state, a voltage is applied to the interconnection 310A, and the MOSFET 303a and the MOSFET 303c operate to electrically connect the source S1 and the drain D13 to each other, and electrically connect the source S3 and the drain D13 to each other. On this occasion, the value of the current flowing through the interconnection 308 becomes I1, and the current flows through the single current path, namely the single extraction interconnection 308a. Therefore, the total width of the current paths becomes WI.

In the case in which only the switch A (the first switch 201) is in the ON state, when focusing attention on the extraction interconnection 308a, only the current with the current value I1/2 flows in the semiconductor integrated circuit device 1001. In other words, it results that in the semiconductor integrated circuit device 1001, there flows only the current half as high as that in the semiconductor integrated circuit device of the related-art example. Such a relationship of the magnitude of the current is not true in the case in which only the switch B (the second switch 202) is in the ON state, but is true in at least the case in which the switch A is in the ON state.

Therefore, in the case in which only the switch A is in the ON state, it results that the extraction interconnection connected to the common drain electrode is relatively hard to be broken due to the electromigration in the semiconductor integrated circuit device 1001.

Further, in the case in which both of the switch A and the switch B are in the ON state, since all of the MOSFETs 303a, 303b, and 303c operate in the semiconductor integrated circuit device 1001, the current with the current value I1 flowing through the interconnection 308 flows through the two current paths, namely the two extraction interconnections 308a, 308b. Therefore, the total width of the current paths on this occasion becomes 2×WI, and the current with the current value I1 flows through either of the extraction interconnections 308a, 308b.

Therefore, in the semiconductor integrated circuit device 1001, since the value of the current flowing through each of the extraction electrodes 308a, 308b hardly varies between the case in which only the switch A is in the ON state and the case in which both are in the ON state, it results that the breakage due to the electromigration is hard to occur except the case in which only the switch B is in the ON state, namely irrespective of the selection of the case in which only the switch A is in the ON state and the case in which both of the switch A and the switch B are in the ON state.

A similar effect will be described focusing attention on the electromigration resistance (EM resistance). Here, the EM resistance of one extraction interconnection (interconnection width WI) is defined as I2. In the semiconductor integrated circuit device 1001, since both of the extraction interconnections 308a, 308b become the current paths in either of the case in which only the switch A is in the ON state, and the case in which both are in the ON state, it is sufficient for the value I1/2 of the current flowing through the extraction interconnection 308a or the extraction interconnection 308b to be equal to or lower than I2. In other words, the upper limit of the acceptable amount of the current I1 flowing through the interconnection 308 becomes equal to or lower than 2×I2 in either of the case in which only the switch A is in the ON state and the case in which both are in the ON state.

Therefore, in view of the EM resistance, also in the semiconductor integrated circuit device 1001 according to the modified example, even in the case in which only either one of the switch A and the switch B is in the ON state, it is possible to make the same current as in the case in which only the switch A is in the ON state, namely a higher current than in the semiconductor integrated circuit device (FIG. 12) in the related-art example, flow through the interconnection 308.

It should be noted that although the P-MOSFET part of the buffer circuit 200 is described hereinabove, the same as above applies to the N-MOSFET part.

1.2.2.2. Example of Providing Drain Electrode with Plurality of Current Paths

Figure 7:
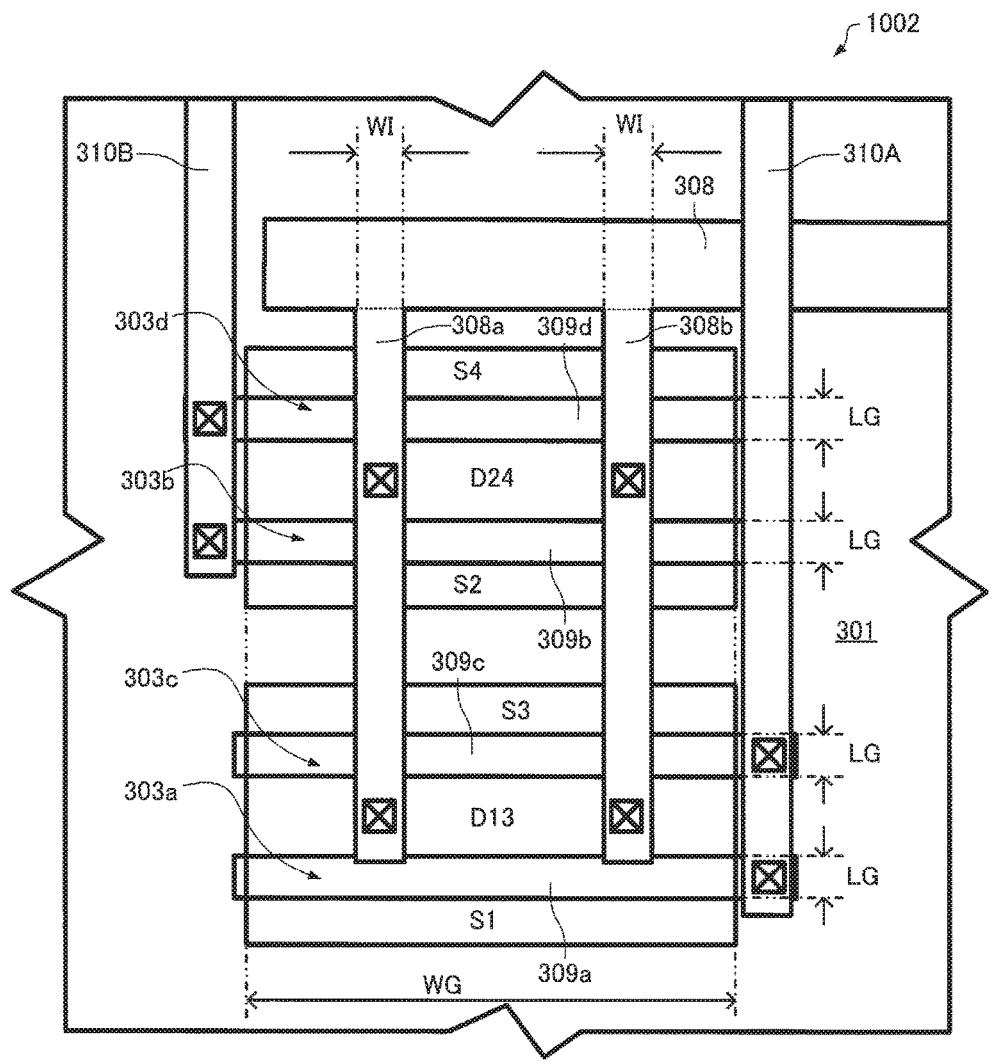
FIG. 7 is a schematic planar view of a semiconductor integrated circuit according to a modified embodiment of the invention.

FIG. 7 is a schematic planar view showing an example of the layout of a semiconductor integrated circuit device 1002 according to a modified embodiment having the four P-MOSFETs 203a, 203b, 203c, and 203d of the buffer circuit 200 arranged in a part on the substrate 301.

Similarly to the semiconductor integrated circuit device 1000 described above, the semiconductor integrated circuit device 1002 has the P-MOSFETs 303a, 303b, 303c, and 303d corresponding respectively to the four P-MOSFETs 203a, 203b, 203c, and 203d.

In FIG. 7, the members exerting substantially the same actions and functions as those of the semiconductor integrated circuit device 1000 described above will be denoted by the same reference symbols, and the explanation thereof will be omitted.

The semiconductor integrated circuit device 1002 has the interconnection 308 electrically connected to the drain D13 shared by the two P-MOSFETs 303a, 303c and the drain D24 shared by the two P-MOSFETs 303b, 303d. The interconnection 308 is an electrically-conducting path extracted while connecting both of the drain electrode D13 and the drain electrode D24 to each other, and is formed of the extraction interconnection 308a and the extraction interconnection 308b joined with each other. Further, in the semiconductor integrated circuit device 1002, from a viewpoint of the drain electrode, the extraction interconnection 308a and the extraction interconnection 308b constitute two electrically-conducting paths.

The extraction interconnection 308a and the extraction interconnection 308b have the same interconnection width WI in the present embodiment. The extraction interconnection 308a and the extraction interconnection 308b form the current paths through which the drain currents of the respective MOSFETs flow. Further, the semiconductor integrated circuit device 1002 has gate electrodes 309a, 309b, 309c, and 309d of the respective four P-MOSFETs 303a, 303b, 303c, and 303d. Further, the semiconductor integrated circuit device 1002 has the interconnection 310A commonly connected to the gate electrode 309a and the gate electrode 309c out of the four gate electrodes 309a, 309b, 309c, and 309d, and the interconnection 310B commonly connected to the gate electrode 309b and the gate electrode 309d.

Further, the interconnection 310A is connected to the switch A (the first switch 201 described above) not shown, and the interconnection 310B is connected to the switch B (the second switch 202 described above) not shown. It should be noted that interconnections not shown are connected to the source electrodes (S) of the respective MOSFETs.

In other words, the semiconductor integrated circuit device 1002 is provided with the first MOSFET 303a including the first source electrode S1, the first gate electrode 309a, and the first drain electrode D13, the second MOSFET 303b including the second source electrode S2, the second gate electrode 309b, and the second drain electrode D24, and the interconnection (the extraction interconnection 308a) extending in a direction crossing a direction in which the first source electrode S1, the first gate electrode 309a, and the first drain electrode D13 are arranged, wherein the first MOSFET 303a and the second MOSFET 303b are the same in polarity, and the first drain electrode D13 and the second drain electrode D24 are electrically connected to each other with the interconnection (the extraction interconnection 308a). Further, the interconnection (the extraction interconnection 308b) extending in a direction crossing a direction in which the first source electrode S1, the first gate electrode 309a, and the first drain electrode D13 are arranged is disposed, and the first drain electrode D13 and the second drain electrode D24 are electrically connected to each other with the interconnection (the extraction interconnection 308b). Therefore, the two extraction interconnections are connected to the single drain electrode.

Similarly to the embodiment described above, there is considered the case in which only either one of the switch A and the switch B is in the ON state. As already described, the sum of the currents flowing through the four P-MOSFETs 303*a*, 303*b*, 303*c*, and 303*d* is the value I1 roughly constant corresponding to the load connected to the output terminal of the output circuit 120. It should be noted that it is also assumed here that the four P-MOSFETs 303*a*, 303*b*, 303*c*, and 303*d* are all equal in WG/LG of the gate electrode to each other.

In the semiconductor integrated circuit device 1002 according to the modified embodiment, in the case in which only the switch A (the first switch 201) is in the ON state, a voltage is applied to the interconnection 310A, and the MOSFET 303*a* and the MOSFET 303*c* operate to electrically connect the source S1 and the drain D13 to each other, and electrically connect the source S3 and the drain D13 to each other. On this occasion, the value of the current flowing through the interconnection 308 becomes I1, and the current flows through the two current paths, namely the two extraction interconnections 308*a*, 308*b*. Therefore, the total width of the current paths on this occasion becomes 2×WI.

Therefore, in the case in which only either one of the switch A and the switch B is in the ON state, it results that the extraction interconnections connected to these common drain electrodes are relatively hard to be broken due to the electromigration also in the semiconductor integrated circuit device 1002 according to the modified embodiment.

A similar effect will be described focusing attention on the electromigration resistance (EM resistance). Here, the EM resistance of one extraction interconnection (interconnection width WI) is defined as I2. Therefore, in the semiconductor integrated circuit device 1002 according to the modified embodiment, in the case in which only either one of the switch A and the switch B is in the ON state, since both of the extraction interconnections 308*a*, 308*b* become the current paths, the value I1 of the current flowing through the extraction interconnection 308*a* or the extraction interconnection 308*b* is required to be equal to or lower than I2. Therefore, in view of the EM resistance, in the semiconductor integrated circuit device 1002 according to the modified embodiment, since both of the extraction interconnections 308*a*, 308*b* become the current paths in either of the case in which only either one of the switch A and the switch B is in the ON state, and the case in which both are in the ON state, it is sufficient for the value I1/2 of the current flowing through the extraction interconnection 308*a* or the extraction interconnection 308*b* to be equal to or lower than I2. In other words, the upper limit of the acceptable amount of the current I1 flowing through the interconnection 308 becomes equal to or lower than 2×I2 in either of the case in which either one of the switch A and the switch B is in the ON state and the case in which both are in the ON state.

It should be noted that although the P-MOSFET part is described hereinabove, the same as above applies to the N-MOSFET part.

1.2.2.3. Example of Providing Extraction Interconnection with Plurality of Current Paths FIG. 8 is a schematic planar view showing an example of the layout of a semiconductor integrated circuit device 1003 according to a modified embodiment having the four P-MOSFETs 203*a*, 203*b*, 203*c*, and 203*d* of the buffer circuit 200 arranged in a part on the substrate 301.

Similarly to the semiconductor integrated circuit device 1000 described above, the semiconductor integrated circuit device 1003 has the P-MOSFETs 303*a*, 303*b*, 303*c*, and 303*d* corresponding respectively to the four P-MOSFETs 203*a*, 203*b*, 203*c*, and 203*d*.

Figure 8:
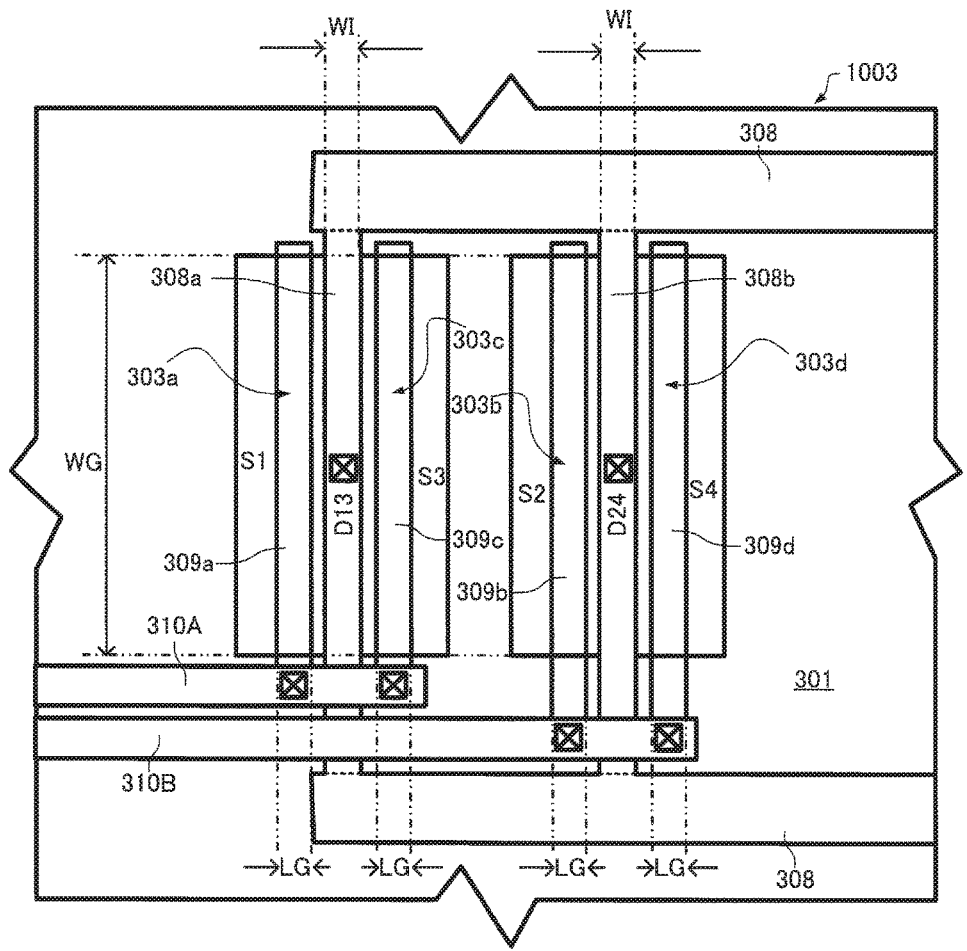
FIG. 8 is a schematic planar view of a semiconductor integrated circuit according to a modified embodiment of the invention.

In FIG. 8, the members exerting substantially the same actions and functions as those of the semiconductor integrated circuit device 1000 described above will be denoted by the same reference symbols, and the explanation thereof will be omitted.

The semiconductor integrated circuit device 1003 has the interconnections 308 electrically connected to the drain D13 shared by the two P-MOSFETs 303*a*, 303*c* and the drain D24 shared by the two P-MOSFETs 303*b*, 303*d*. The interconnections 308 are each an electrically-conducting path extracted while connecting both of the drain electrode D13 and the drain electrode D24 to each other, and are each formed of the extraction interconnection 308*a* and the extraction interconnection 308*b* joined with each other. Further, the extraction interconnection 308*a* and the extraction interconnection 308*b* are each connected to the interconnections 308 at two places. Therefore, also in the semiconductor integrated circuit device 1003, from a viewpoint of the drain electrode, the two electrically-conducting paths are formed at both ends of each of the extraction interconnection 308*a* and the extraction interconnection 308*b*.

The extraction interconnection 308*a* and the extraction interconnection 308*b* have the same interconnection width WI in the present embodiment. The extraction interconnection 308*a* and the extraction interconnection 308*b* form the current paths through which the drain currents of the respective MOSFETs flow.

Further, the semiconductor integrated circuit device 1003 has the gate electrodes 309*a*, 309*b*, 309*c*, and 309*d* of the respective four P-MOSFETs 303*a*, 303*b*, 303*c*, and 303*d*. Further, the semiconductor integrated circuit device 1003 has the interconnection 310A commonly connected to the gate electrode 309*a* and the gate electrode 309*c* out of the four gate electrodes 309*a*, 309*b*, 309*c*, and 309*d*, and the interconnection 310B commonly connected to the gate electrode 309*b* and the gate electrode 309*d*. Further, the interconnection 310A is connected to the switch A (the first switch 201 described above) not shown, and the interconnection 310B is connected to the switch B (the second switch 202 described above) not shown. It should be noted that interconnections not shown are connected to the source electrodes (S) of the respective MOSFETs.

In other words, the semiconductor integrated circuit device 1003 is provided with the first MOSFET 303*a* including the first source electrode S1, the first gate electrode 309*a*, and the first drain electrode D13, the second MOSFET 303*b* including the second source electrode S2, the second gate electrode 309*b*, and the second drain electrode D24, the third MOSFET 303*c* including the third source electrode S3, the third gate electrode 309*c*, and the first drain electrode D13, and the fourth MOSFET 303*d* including the fourth source electrode S4, the fourth gate electrode 309*d*, and the second drain electrode D24, wherein the first MOSFET 303*a*, the second MOSFET 303*b*, third MOSFET 303*c* and the fourth MOSFET 303*d* are the same in polarity, the first gate electrode 309*a* and the third gate electrode 309*c* are electrically connected to each other, the second gate electrode 309*b* and the fourth gate electrode 309*d* are electrically connected to each other, and the first drain electrode D13 and the second drain electrode D24 are electrically connected to each other with the common interconnections 308. Further, the interconnections 308 for connecting the first drain electrode D13 and the second drain electrode D24 to each other are connected to the both ends of each of the extraction interconnection 308*a* and the extraction interconnection 308*b*, respectively. Therefore, the two current paths via the extraction interconnections exist for each of the drain electrodes.

Similarly to the embodiment described above, there is considered the case in which only either one of the switch A and the switch B is in the ON state. As already described, the sum of the currents flowing through the four P-MOSFETs 303a, 303b, 303c, and 303d is the constant value I1 corresponding to the load connected to the output terminal of the output circuit 120. It should be noted that it is also assumed here that the four P-MOSFETs 303a, 303b, 303c, and 303d are all equal in WG/LG of the gate electrode to each other.

In the semiconductor integrated circuit device 1003 according to the modified embodiment, in the case in which only the switch A (the first switch 201) is in the ON state, a voltage is applied to the interconnection 310A, and the MOSFET 303a and the MOSFET 303c operate to electrically connect the source S1 and the drain D13 to each other, and electrically connect the source S3 and the drain D13 to each other. On this occasion, the value of the current flowing through the interconnections 308 becomes I1, and it results that the two current paths exist at the both ends of the extraction interconnection 308a. Therefore, the total width of the current paths on this occasion becomes 2×WI.

Therefore, in the case in which only either one of the switch A and the switch B is in the ON state, it results that the extraction interconnections connected to these common drain electrodes are relatively hard to be broken due to the electromigration also in the semiconductor integrated circuit device 1003 according to the modified embodiment.

A similar effect will be described focusing attention on the electromigration resistance (EM resistance). Here, the EM resistance of one extraction interconnection (interconnection width WI) is defined as I2. Therefore, in the semiconductor integrated circuit device 1003 according to the modified embodiment, since both of the extraction interconnections 308a, 308b become the current paths in either of the case in which only either one of the switch A and the switch B is in the ON state, and the case in which both are in the ON state, it is sufficient for the value I1/2 of the current flowing through the extraction interconnection 308a or the extraction interconnection 308b to be equal to or lower than I2. In other words, the upper limit of the acceptable amount of the current I1 flowing through the interconnection 308 becomes equal to or lower than 2×I2 in either of the case in which either one of the switch A and the switch B is in the ON state and the case in which both are in the ON state. Therefore, in view of the EM resistance, in the semiconductor integrated circuit device 1003 according to the modified embodiment, even in the case in which only either one of the switch A and the switch B is in the ON state, the same current as in the case in which both of the switch A and the switch B are in the ON state can be made to flow.

It should be noted that although the P-MOSFET part is described hereinabove, the same as above applies to the N-MOSFET part.

1.2.2.4. Example of Providing A Number of MOSFETs

Figure 9:
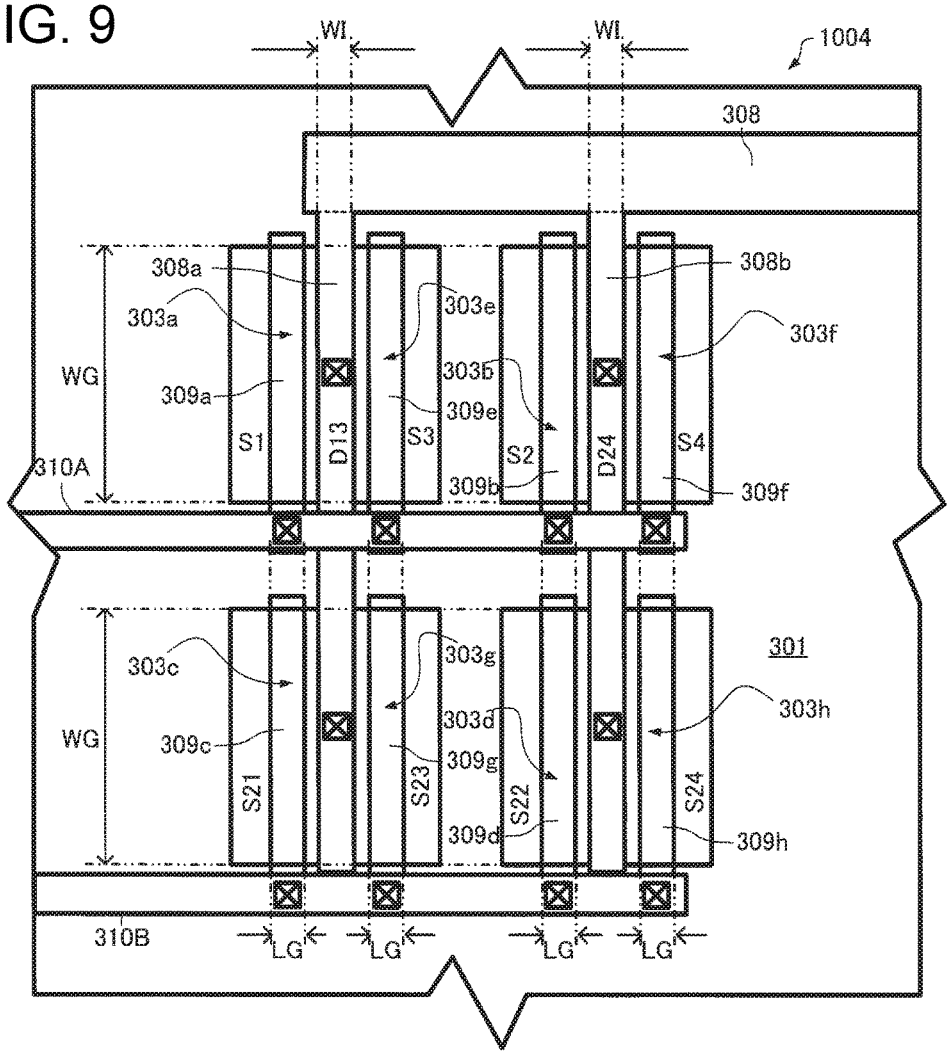
FIG. 9 is a schematic planar view of a semiconductor integrated circuit according to a modified embodiment of the invention.

FIG. 9 is a schematic planar view of a semiconductor integrated circuit device 1004 as an example of the layout of the semiconductor integrated circuit having eight P-MOSFETs 203a, 203b, 203c, 203d, 203e, 203f, 203g, and 203h arranged in a part on the substrate 301.

The semiconductor integrated circuit device 1004 has eight P-MOSFETs 303a, 303b, 303c, 303d, 303e, 303f, 303g, and 303h. Further, the semiconductor integrated circuit device 1004 has the interconnection 308 electrically connected to the drain (D13) shared by the four P-MOSFETs 303a, 303c, 303e, and 303g, and the drain (D24) shared by the four P-MOSFETs 303b, 303d, 303f, and 303h. The interconnection 308 is an electrically-conducting path extracted from each of the drain electrode D13 and the drain electrode D24, and is formed of an extraction interconnection 308a and an extraction interconnection 308b joined with each other.

The extraction interconnection 308a and the extraction interconnection 308b have the same interconnection width WI in the present modified embodiment. The extraction interconnection 308a and the extraction interconnection 308b form the current paths through which the drain currents of the respective MOSFETs flow.

Further, the semiconductor integrated circuit device 1004 has the gate electrodes 309a, 309b, 309c, 309d, 309e, 309f, 309g, and 309h of the respective eight P-MOSFETs 303a, 303b, 303c, 303d, 303e, 303f, 303g, and 303h. Further, the semiconductor integrated circuit device 1004 has the interconnection 310A commonly connected to the gate electrode 309a, the gate electrode 309e, the gate electrode 309b, and the gate electrode 309f out of the eight gate electrodes, and the interconnection 310B commonly connected to the gate electrode 309c, the gate electrode 309g, the gate electrode 309d, and the gate electrode 309h.

Further, the interconnection 310A is connected to the switch A (corresponding to the first switch 201 described above) not shown, and the interconnection 310B is connected to the switch B (corresponding to the second switch 202 described above) not shown. It should be noted that interconnections not shown are connected to the source electrodes (specifically an impurity diffused layers) of the respective MOSFETs.

In other words, it can be said that the semiconductor integrated circuit device 1004 is provided with the first MOSFET 303a including the first source electrode S1, the first gate electrode 309a, and the first drain electrode D13, the second MOSFET 303b including the second source electrode S2, the second gate electrode 309b, and the second drain electrode D24, the third MOSFET 303e including the third source electrode S3, the third gate electrode 309e, and the first drain electrode D13 shared with the first MOSFET 303a, and the fourth MOSFET 303f including the fourth source electrode S4, the fourth gate electrode 309f, and the second drain electrode D24 shared with the second MOSFET 303b.

Further, the semiconductor integrated circuit device 1004 is provided with similar patterns to the first MOSFET 303a, the second MOSFET 303b, the third MOSFET 303e, and the fourth MOSFET 303f along a direction (or a direction crossing a direction in which the first source electrode S1, the first gate electrode 309a, and the first drain electrode D13 are arranged) in which the first drain electrode D13 extends.

Specifically, the semiconductor integrated circuit device 1004 is provided with a fifth MOSFET 303c including a fifth source electrode S21, a fifth gate electrode 309c, and the first drain electrode D13, a sixth MOSFET 303d including a sixth source electrode S22, a sixth gate electrode 309d, and the second drain electrode D24, a seventh MOSFET 303g including a seventh source electrode S23, a seventh gate electrode 309g, and the first drain electrode D13, and an eighth MOSFET 303h including an eighth source electrode S24, an eighth gate electrode 309h, and the second drain electrode D24. Further, the first MOSFET 303a through the eighth MOSFET 303h are the same in polarity (the P-channel type), the first gate electrode 309a through the fourth gate electrode 309f are electrically connected to each other, and the fifth gate electrode 309c through the eighth gate electrode 309h are electrically connected to each other.

Similarly to the embodiment described above, there is considered the case in which only either one of the switch A and the switch B is in the ON state. As already described, the sum of the currents flowing through the eight P-MOSFETs 303a, 303b, 303c, 303d, 303e, 303f, 303g, and 303h is the constant value I1 corresponding to the load connected to the output terminal of the output circuit 120. It should be noted that it is also assumed here that the eight P-MOSFETs 303a, 303b, 303c, 303d, 303e, 303f, 303g, and 303h are all equal in WG/LG of the gate electrode to each other.

In the semiconductor integrated circuit device 1004 according to the modified embodiment, in the case in which only the switch A (the first switch 201) is in the ON state, a voltage is applied to the interconnection 310A, and the MOSFET 303a, the MOSFET 303b, the MOSFET 303e, and the MOSFET 303f operate to electrically connect the source S1, the source S3, and the drain D13 to each other, and electrically connect the source S2, the source S4, and the drain D24 to each other. On this occasion, the value of the current flowing through the interconnection 308 becomes I1, and the current flows through the two current paths, namely the two extraction interconnections 308a, 308b. Therefore, the total width of the current paths on this occasion becomes 2×WI.

Therefore, in the case in which only either one of the switch A and the switch B is in the ON state, it results that the extraction interconnections connected to these common drain electrodes are relatively hard to be broken due to the electromigration also in the semiconductor integrated circuit device 1004 according to the modified embodiment.

A similar effect will be described focusing attention on the electromigration resistance (EM resistance). Here, the EM resistance of one extraction interconnection (interconnection width WI) is defined as I2. Therefore, in the semiconductor integrated circuit device 1004 according to the modified embodiment, since both of the extraction interconnections 308a, 308b become the current paths in either of the case in which only either one of the switch A and the switch B is in the ON state, and the case in which both are in the ON state, it is sufficient for the value I1/2 of the current flowing through the extraction interconnection 308a or the extraction interconnection 308b to be equal to or lower than I2. In other words, the upper limit of the acceptable amount of the current I1 flowing through the interconnection 308 becomes equal to or lower than 2×I2 in either of the case in which either one of the switch A and the switch B is in the ON state and the case in which both are in the ON state. Therefore, in view of the EM resistance, in the semiconductor integrated circuit device 1004 according to the modified embodiment, even in the case in which only either one of the switch A and the switch B is in the ON state, the same current as in the case in which both of the switch A and the switch B are in the ON state can be made to flow.

It should be noted that although the P-MOSFET part is described hereinabove, the same as above applies to the N-MOSFET part.

1.2.3. Relationship Between Channel Width and Interconnection Width

It is also possible for the semiconductor integrated circuit device according to any one of the embodiment and the modified embodiments described above to be provided with an adjuster. The adjuster selects at least one MOSFET from at least two MOSFETs provided to the semiconductor circuit device. The adjuster is capable of switching between a first state in which the first MOSFET is selected and the second MOSFET is not selected, and a second state in which both of the first MOSFET and the second MOSFET are selected.

Further, in the semiconductor integrated circuit device according to any one of the embodiment and the modified embodiments described above, a ratio of the sum of the widths of the parts to be the current paths out of the interconnections in the second state to the sum of the widths of the parts to be the current paths out of the interconnections in the first state is lower than a ratio of the sum of the channel widths of the MOSFETs selected in the second state to the sum of the channel widths of the MOSFETs selected in the first state.

A specific explanation will be presented using the semiconductor integrated circuit device 1000 shown in FIG. 5. The first state corresponds to the case in which only either one of the switch A and the switch B is in the ON state described above. Further, the second state corresponds to the case in which both of the switch A and the switch B are in the ON state.

The sum of the widths of the parts to be the current paths out of the interconnections in the first state is twice as large as the width (WI) of the extraction interconnection 308a and the extraction interconnection 308b. Further, the sum of the widths of the parts to be the current paths out of the interconnections in the second state is twice as large as the width (WI) of the extraction interconnection 308a and the extraction interconnection 308b. Therefore, the ratio of the sum of the widths of the parts to be the current paths out of the interconnections in the second state to the sum of the widths of the parts to be the current paths out of the interconnections in the first state becomes 1.

On the other hand, the sum of the channel widths of the MOSFETs selected in the first state is twice as large as the width (the channel width WG) of the gate electrode. Further, the sum of the channel widths of the MOSFETs selected in the second state is four times as large as the width (the channel width WG) of the gate electrode. Therefore, the ratio of the sum of the channel widths of the MOSFETs selected in the second state to the sum of the channel widths of the MOSFETs selected in the first state becomes 2.

Therefore, in the semiconductor integrated circuit device 1000 according to the embodiment, the ratio of the sum of the widths of the parts to be the current paths out of the interconnections in the second state to the sum of the widths of the parts to be the current paths out of the interconnections in the first state is lower than the ratio of the sum of the channel widths of the MOSFETs selected in the second state to the sum of the channel widths of the MOSFETs selected in the first state.

Further, it can be said that in the semiconductor integrated circuit device 1000 according to the embodiment, the sum of the widths of the parts to be the current paths out of the interconnections does not vary between the first state and the second state. In other words, as described above, in either of the first state and the second state, the interconnection width is 2×WI.

Such a relationship between the channel width and the interconnection width is substantially the same in the semiconductor integrated circuit devices 1001, 1002, 1003, and 1004 according to the modified embodiments.

It should be noted that although the detailed description will be omitted, in the semiconductor integrated circuit device according to the related-art example shown in FIG. 12, the ratio of the sum of the widths of the parts to be the current paths out of the interconnections in the second state to the sum of the widths of the parts to be the current paths out of the interconnections in the first state is equal to the ratio of the sum of the channel widths of the MOSFETs selected in the second state to the sum of the channel widths of the MOSFETs selected in the first state.

1.2.4. Functions and Advantages

As described above, the buffer circuit 200 according to the present embodiment is capable of switching the drive capability without significantly degrading the electromigration resistance.

According to the buffer circuit (the semiconductor integrated circuit device) related to each of the embodiments described above, even if the selection of the plurality of MOSFETs is changed, it is hard for the total width of the interconnections of the current paths to significantly change. In other words, according to the buffer circuit related to the embodiment described above, even if the drive capability is changed, it is hard for the width of the current path to decrease, and thus, the electromigration resistance can be maintained in good condition. Thus, it is possible for the buffer circuit to operate with high reliability even if the drive capability is changed.

2. Electronic Apparatus

Figure 10:
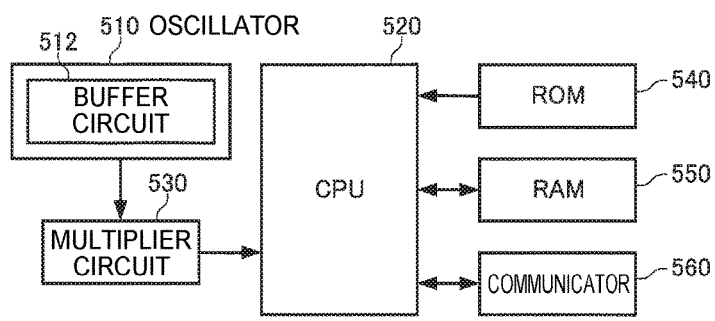
FIG. 10 is a functional block diagram showing an example of a configuration of an electronic apparatus according to an embodiment of the invention.

FIG. 10 is a functional block diagram showing an example of a configuration of an electronic apparatus according to the embodiment. The electronic apparatus 500 according to the present embodiment is configured including an oscillator 510, a central processing unit (CPU) 520, a multiplier circuit 530, a read only memory (ROM) 540, a random access memory (RAM) 550, and a communicator 560. It should be noted that the electronic apparatus according to the present embodiment can be provided with a configuration obtained by eliminating or modifying some of the constituents (sections) shown in FIG. 10, or adding other constituents thereto.

The oscillator 510 is for outputting an oscillation signal with a specified frequency based on a signal from an oscillation source using a buffer circuit 512.

The multiplier circuit 530 is a circuit for multiplying the frequency of the oscillation signal output by the oscillator 510 (the buffer circuit 512) into a specified frequency, and then outputting the result. The oscillation signal output by the multiplier circuit 530 can be used as a clock signal of the CPU 520, or can be used for the CPU 520 to generate a carrier wave for the communication.

The CPU 520 (a processor) performs, for example, a variety of types of arithmetic processing and control processing based on the oscillation signal output by the oscillator 510 or the oscillation signal output by the multiplier circuit 530 in accordance with the program stored in the ROM 540 and so on.

The ROM 540 stores the programs, data, and so on for the CPU 520 to perform the variety of types of arithmetic processing and control processing.

The RAM 550 is used as a working area of the CPU 520, and temporarily stores the program and data retrieved from the ROM 540, the calculation result obtained by the CPU 520 performing operations in accordance with the variety of programs, and so on.

The communication section 560 performs a variety of types of control for achieving the data communication between the CPU 520 and the external devices.

For example, by applying the buffer circuit 200 in the embodiment or each of the modified examples described above as the buffer circuit 512, or by applying the oscillator 1 (equipped with the buffer circuit 200) of the embodiment or each of the modified examples described above as the oscillator 510, cost reduction of the electronic apparatus 500 can be realized.

As such an electronic apparatus 500, a variety of electronic apparatuses can be adopted, and there can be cited, for example, a GPS (global positioning system) module, a network apparatus, a broadcast apparatus, a communication apparatus used in an artificial satellite or a base station, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a base station apparatus for a mobile terminal, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS (point of sale) terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

As an example of the electronic apparatus 500 according to the present embodiment, there can be cited a transmission device using the oscillator 510 equipped with the buffer circuit 512 as a reference signal source, and functioning as, for example, a terminal base station device for performing communication with terminals wirelessly or with wire. For example, by applying the buffer circuit 200 in the embodiment or each of the modified examples described above as the buffer circuit 512, or by applying the oscillator 1 (equipped with the buffer circuit 200) of the embodiment or each of the modified examples described above as the oscillator 510, the electronic apparatus 500, which can be used for, for example, the communication base station, which is higher in frequency accuracy than ever before, and to which high performance and high reliability are required, can also be realized at lower cost.

Further, as another example of the electronic apparatus 500 according to the present embodiment, it is possible to adopt a communication device in which the communicator 560 receives an external clock signal, and the CPU 520 (the processor) includes a frequency controller for controlling the frequency of the oscillator 510 based on the external clock signal and one of the output signal of the oscillator 510 and the output signal (an internal clock signal) of the multiplier circuit 530. The communication device can be a communication apparatus used for, for example, a backbone network apparatus such as stratum, or a femtocell.

3. Base Station

Figure 11:
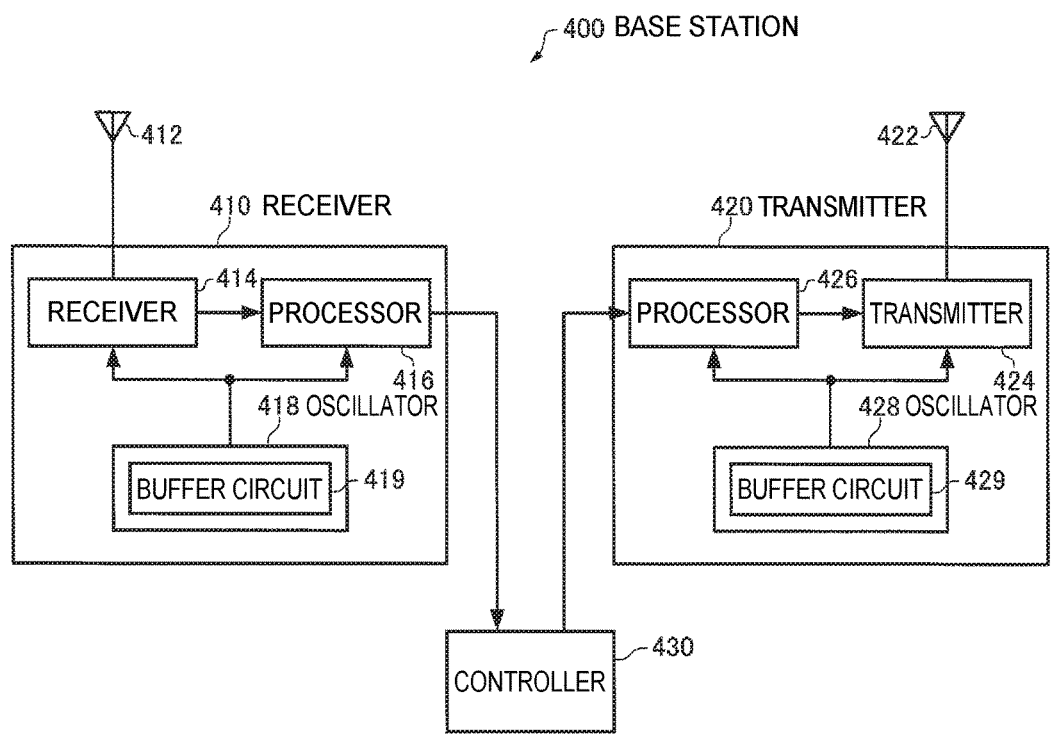
FIG. 11 is a diagram showing an example of a schematic configuration of a base station according to an embodiment of the invention.

FIG. 11 is a diagram showing an example of a schematic configuration of a base station according to the embodiment of the invention. The base station 400 according to the present embodiment is configured including a receiver 410, a transmitter 420, and a controller 430. It should be noted that the electronic apparatus according to the present embodiment can be provided with a configuration obtained by eliminating or modifying some of the constituents (sections) shown in FIG. 11, or adding other constituents thereto.

The receiver 410 is configured including a receiving antenna 412, a receiver 414, a processor 416, and an oscillator 418.

The oscillator 418 is for outputting an oscillation signal with a specified frequency based on a signal from an oscillation source using a buffer circuit 419.

The receiving antenna 412 receives a radio wave with a variety of types of information superimposed from a mobile station (not shown) such as a mobile phone or a GPS satellite.

The receiver 414 demodulates the signal received by the receiving antenna 412 into a signal in a specified intermediate frequency (IF) band using the oscillation signal output by the oscillator 418 (the buffer circuit 419).

The processor 416 converts the signal in the intermediate frequency band demodulated by the receiver 414 into a baseband signal using the oscillation signal output by the oscillator 418, and then detects the information included in the baseband signal.

The controller 430 receives the information detected by the receiver 410 (the processor 416) to perform a variety of processes corresponding to the information. Then, the controller 430 generates information to be transmitted to the mobile station, and then transmits the information to the transmitter 420 (a processor 426).

The transmitter 420 is configured including a transmitting antenna 422, a transmitter 424, the processor 426, and an oscillator 428.

The oscillator 428 is for outputting an oscillation signal with a specified frequency based on a signal from an oscillation source using a buffer circuit 429.

The processor 426 generates a baseband signal using the information received from the controller 430, and then converts the baseband signal into a signal in the intermediate frequency band using the oscillation signal output by the oscillator 428 (the buffer circuit 429).

The transmitter 424 modulates the signal in the intermediate frequency band from the processor 426 and then superimposes the result on the carrier wave using the oscillation signal output by the oscillator 428.

The transmitting antenna 422 transmits the carrier wave from the transmitter 424 to the mobile station such as a mobile phone or a GPS satellite as a radio wave.

By applying the buffer circuit 200 in the embodiment or each of the modified examples described above as the buffer circuit 419 provided to the receiver 410 or the buffer circuit 429 provided to the transmitter 420, or by applying the oscillator 1 (equipped with the buffer circuit 200) of the embodiment or each of the modified examples described above as the oscillator 418 provided to the receiver 410 or the oscillator 428 provided to the transmitter 420, the base station superior in communication performance and high in reliability can be realized at lower cost.

The invention is not limited to the embodiments, but can be implemented with a variety of modifications within the scope or the spirit of the invention.

For example, although the oscillator of the embodiment described above is the oven controlled oscillator, the invention is not limited to the oven controlled oscillator, but can also be applied to, for example, a temperature compensated oscillator (e.g., a temperature compensated crystal oscillator (TCXO)) having the temperature compensation function, a voltage controlled oscillator (e.g., voltage controlled crystal oscillator (VCXO)) having a frequency control function, or an oscillator (e.g., a voltage controlled temperature compensated crystal oscillator (VC-TCXO)) having the temperature compensation function and the frequency control function.

The embodiments and the modified examples described above are illustrative only, and the invention is not limited to the embodiments and the modified examples. For example, it is also possible to arbitrarily combine the embodiment and the modified examples described above.

The invention is not limited to the embodiment described above, but can further be variously modified. For example, the invention includes configurations (e.g., configurations having the same function, the same way, and the same result, or configurations having the same object and the same advantage) substantially the same as the configuration described as the embodiment. Further, the invention includes configurations obtained by replacing a non-essential part of the configuration explained in the above description of the embodiments. Further, the invention includes configurations providing the same functions and the same advantage, or configurations capable of achieving the same object, as the configuration explained in the description of the embodiments. Further, the invention includes configurations obtained by adding a known technology to the configuration explained in the description of the embodiments.

What is claimed is:

1. A buffer circuit comprising:
    a first MOSFET comprising a first source electrode, a first gate electrode, and a first drain electrode;
    a second MOSFET, which comprises a second source electrode, a second gate electrode, and a second drain electrode, and is same in polarity as the first MOSFET, the second gate electrode being electrically connected to the first gate electrode;
    a third MOSFET comprising a third source electrode, a third gate electrode, and the first drain electrode; and
    a first switch connected to the third gate electrode and the first gate electrode.

2. The buffer circuit according to claim 1, wherein the first drain electrode and the second drain electrode are electrically connected to each other with a common interconnection.

3. The buffer circuit according to claim 1, wherein the first MOSFET and the third MOSFET are same in polarity as each other.

4. The buffer circuit according to claim 1, further comprising:
    a second switch connected to the second gate electrode.

5. A buffer circuit comprising:
    at least two MOSFETs comprising a first MOSFET and a second MOSFET; and
    an interconnection through which a signal from the MOSFET is transmitted,
    wherein a ratio of a sum of widths of parts to be current paths out of the interconnections, in a second state in which the first MOSFET and the second MOSFET are selected, to a sum of widths of parts to be current paths out of the interconnections in a first state, in which the first MOSFET is selected and the second MOSFET is unselected, is lower than a ratio of a sum of a channel width of the first MOSFET and a channel width of the second MOSFET in the second state to a sum of channel widths of the first MOSFET in the first state.

6. The buffer circuit according to claim 5, wherein the sum of the widths of the parts to be the current paths out of the interconnections is kept substantially constant between the first state and the second state.

7. A buffer circuit comprising:
    a first MOSFET comprising a first source electrode, a first gate electrode, and a first drain electrode;
    a second MOSFET, which comprises a second source electrode, a second gate electrode, and a second drain electrode, and is same in polarity as the first MOSFET, the second gate electrode being electrically connected to the first gate electrode; and a frequency divider, which is disposed in an anterior stage of the first and second MOSFETs, and division ratio of which can be selected.

8. A semiconductor integrated circuit device comprising: the buffer circuit according to claim 1.

9. An oscillator comprising:
an oscillation element;
an oscillation circuit configured to oscillate the oscillation element; and
the buffer circuit according to claim 1.

10. An electronic apparatus comprising:
the buffer circuit according to claim 1.

11. A base station comprising:
the buffer circuit according to claim 1.

12. A buffer circuit comprising:
a first MOSFET comprising a first source electrode, a first gate electrode, and a first drain electrode;
a second MOSFET, which comprises a second source electrode, a second gate electrode, and a second drain electrode, and is same in polarity as the first MOSFET, the second gate electrode being electrically connected to the first gate electrode;
a third MOSFET comprising a third source electrode, a third gate electrode, and the first drain electrode; and
a fourth MOSFET comprising a fourth source electrode, a fourth gate electrode, and the second drain electrode, wherein the third MOSFET and the fourth MOSFET are same in polarity as each other.

13. The buffer circuit according to claim 12, wherein the first MOSFET and the third MOSFET are same in polarity as each other.

14. The buffer circuit according to claim 12, wherein the third gate electrode and the fourth gate electrode are electrically connected to each other.

15. The buffer circuit according to claim 12, further comprising:
a switch connected to the second gate electrode.

16. The buffer circuit according to claim 15, wherein the second gate electrode is connected to the fourth gate electrode.

17. The buffer circuit according to claim 12, wherein the first drain electrode and the second drain electrode are electrically connected to each other with a common interconnection.

18. A semiconductor integrated circuit device comprising: the buffer circuit according to claim 12.

19. An oscillator comprising:
an oscillation element;
an oscillation circuit configured to oscillate the oscillation element; and
the buffer circuit according to claim 12.

20. An electronic apparatus comprising:
the buffer circuit according to claim 12.

* * * * *